(12) United States Patent
Kim et al.

(10) Patent No.: US 9,184,136 B2
(45) Date of Patent: Nov. 10, 2015

(54) SEMICONDUCTOR DEVICES AND METHODS FOR FABRICATING THE SAME

(71) Applicant: Samsung Electronics Co., Ltd., Suwon-si, Gyeonggi-do (KR)

(72) Inventors: Jiyoung Kim, Yongin-si (KR); Daeik Kim, Hwaseong-si (KR); Kang-Uk Kim, Seoul (KR); Nara Kim, Seongnam-si (KR); Jemin Park, Suwon-si (KR); Kyuhyun Lee, Hwaseong-si (KR); Hyun-Woo Chung, Yongin-si (KR); Gyoyoung Jin, Seoul (KR); HyeongSun Hong, Seongnam-si (KR); Yoosang Hwang, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/141,947

(22) Filed: Dec. 27, 2013

(65) Prior Publication Data
US 2014/0246782 A1 Sep. 4, 2014

(30) Foreign Application Priority Data
Mar. 4, 2013 (KR) .................. 10-2013-0022848

(51) Int. Cl.
| | |
|---|---|
| *H01L 23/544* | (2006.01) |
| *H01L 23/48* | (2006.01) |
| *H01L 21/683* | (2006.01) |
| *H01L 27/06* | (2006.01) |

(Continued)

(52) U.S. Cl.
CPC .......... *H01L 23/544* (2013.01); *H01L 21/6835* (2013.01); *H01L 21/76898* (2013.01); *H01L 23/481* (2013.01); *H01L 27/0688* (2013.01); *H01L 27/1464* (2013.01); *H01L 27/14632* (2013.01); *H01L 27/14634* (2013.01); *H01L 27/10897* (2013.01); *H01L 2221/6835* (2013.01); *H01L 2221/68327* (2013.01); *H01L 2221/68363* (2013.01); *H01L 2223/54426* (2013.01); *H01L 2924/0002* (2013.01)

(58) Field of Classification Search
USPC ........... 257/621, 774, 797, E21.597, E23.179
See application file for complete search history.

(56) References Cited

U.S. PATENT DOCUMENTS

| | | |
|---|---|---|
| 5,508,222 A | 4/1996 | Sakao |
| 5,702,984 A | 12/1997 | Bertin et al. |

(Continued)

FOREIGN PATENT DOCUMENTS

| | | |
|---|---|---|
| JP | 2000-228502 | 8/2000 |
| JP | 2006-261178 | 9/2006 |

(Continued)

*Primary Examiner* — Jasmine Clark
(74) *Attorney, Agent, or Firm* — Lee & Morse, P.C.

(57) ABSTRACT

A method of fabricating a semiconductor device includes providing a semiconductor substrate having a first surface and a second surface opposite the first surface, forming an alignment key and a connection contact that penetrate a portion of the semiconductor substrate and extend from the first surface toward the second surface, forming a first circuit on the first surface of the semiconductor substrate such that the first circuit is electrically connected to the connection contact, recessing the second surface of the semiconductor substrate to form a third surface exposing the alignment key and the connection contact, and forming a second circuit on the third surface of the semiconductor substrate such that the second circuit is electrically connected to the connection contact.

15 Claims, 39 Drawing Sheets

(51) Int. Cl.
*H01L 27/146* (2006.01)
*H01L 21/768* (2006.01)
*H01L 27/108* (2006.01)

(56) References Cited

U.S. PATENT DOCUMENTS

| | | |
|---|---|---|
| 6,746,911 B2 | 6/2004 | Han |
| 6,791,863 B2 | 9/2004 | Oguchi et al. |
| 6,921,960 B2 | 7/2005 | Ichige et al. |
| 7,046,522 B2 | 5/2006 | Sung et al. |
| 7,381,508 B2 * | 6/2008 | Kang et al. ................ 430/22 |
| 7,465,604 B2 * | 12/2008 | Heo ................ 438/95 |
| 7,800,197 B2 | 9/2010 | Hwang et al. |
| 8,274,792 B2 | 9/2012 | Soffer |
| 8,278,167 B2 | 10/2012 | Sandhu |
| 8,288,816 B2 | 10/2012 | Komori et al. |
| 2002/0005594 A1 * | 1/2002 | Iwamatsu ................ 257/797 |
| 2005/0063369 A1 | 3/2005 | Choudhury et al. |
| 2007/0126085 A1 * | 6/2007 | Kawano et al. ................ 257/621 |
| 2008/0150077 A1 | 6/2008 | Han |
| 2014/0054774 A1 * | 2/2014 | Uchida et al. ................ 257/751 |

FOREIGN PATENT DOCUMENTS

| | | |
|---|---|---|
| KR | 10-2008-0099170 A | 11/2008 |
| KR | 10-2009-0094571 A | 9/2009 |
| KR | 10-2009-0124628 A | 12/2009 |

\* cited by examiner

SEMICONDUCTOR DEVICES AND METHODS FOR FABRICATING THE SAME

CROSS-REFERENCE TO RELATED APPLICATION

Korean Patent Application No. 10-2013-0022848, filed on Mar. 4, 2013, in the Korean Intellectual Property Office, and entitled: "Semiconductor Devices and Methods for Fabricating the Same," is incorporated by reference herein in its entirety.

BACKGROUND

1. Field

Embodiments relate to semiconductor devices and methods for fabricating the same.

2. Description of the Related Art

Together with the development of manufacturing techniques, the fabrication of semiconductor devices of with greater fineness and high integration is desirable.

SUMMARY

Embodiments are directed to a method of fabricating a semiconductor device including providing a semiconductor substrate having a first surface and a second surface opposite the first surface, forming an alignment key and a connection contact that penetrate a portion of the semiconductor substrate and extend from the first surface toward the second surface, forming a first circuit on the first surface of the semiconductor substrate such that the first circuit is electrically connected to the connection contact, recessing the second surface of the semiconductor substrate to form a third surface exposing the alignment key and the connection contact, and forming a second circuit on the third surface of the semiconductor substrate such that the second circuit is electrically connected to the connection contact.

One of the first circuit and the second circuit may include a cell array including a cell transistor and the other of the first circuit and the second circuit may include a peripheral circuit including a peripheral transistor. The cell and peripheral transistors may be symmetric with respect to the semiconductor substrate.

Forming the first circuit may include forming a peripheral circuit including a peripheral transistor and a metal line on the first surface of the semiconductor substrate. Forming the second circuit may include forming a cell array including a cell transistor, a bit line and a capacitor on the third surface of the semiconductor substrate. The connection contact may be formed simultaneously with the metal line.

The method may further include attaching a support substrate onto the peripheral circuit before forming the cell array. The cell array may be stacked over the peripheral circuit on the support substrate.

The method may further include forming an external terminal electrically connected to the metal line on the first surface of the semiconductor substrate.

Forming the first circuit may include forming a cell array including a cell transistor, a bit line and a capacitor on the first surface of the semiconductor substrate. Forming the second circuit may include forming a peripheral circuit including a peripheral transistor and a metal line on the third surface of the semiconductor substrate. The connection contact may be formed simultaneously with the bit line.

The method may further include attaching a support substrate onto the cell array before forming the peripheral circuit. The peripheral circuit may be stacked over the cell array on the support substrate.

Forming the second circuit may include forming a peripheral circuit including a peripheral transistor and a metal line on the third surface of the semiconductor substrate. Forming the first circuit may include forming a first layer including a cell transistor and a bit line on the first surface of the semiconductor substrate, before forming the second circuit, and forming a second layer including a capacitor on the first surface of the semiconductor substrate, the first and second layers constituting a cell array, after forming the second circuit. The connection contact may be formed simultaneously with the bit line.

The method may further include attaching a first substrate onto the first layer before forming the peripheral circuit, and attaching a second substrate onto the peripheral circuit and removing the first substrate before forming the second layer. The cell array may be stacked over the peripheral circuit on the second substrate.

The method may further include forming an external terminal electrically connected to the metal line on the third surface of the semiconductor substrate.

Embodiments are also directed to a semiconductor device including a semiconductor substrate including a upper surface and a lower surface, the lower surface being opposite the upper surface, an upper circuit on the upper surface of the semiconductor substrate, a lower circuit on the lower surface of the semiconductor substrate, a vertical connection contact that penetrates the semiconductor substrate to electrically connect the upper circuit to the lower circuit, and an alignment key that penetrates the semiconductor substrate to vertically align the upper circuit with the lower circuit.

The upper circuit may include a cell array including a cell transistor. The lower circuit may include a peripheral circuit including a peripheral transistor. The cell transistor and the peripheral transistor may be vertically symmetric with respect to the semiconductor substrate.

The cell array may further include a bit line electrically connected to the cell transistor. The lower circuit may further include a metal line electrically connected to the peripheral transistor. The connection contact may electrically connect the bit line to the metal line.

The semiconductor device may further include a support substrate attached onto the lower circuit, a via that penetrates the support substrate to be electrically connected to the metal line, and a pad disposed on the support substrate to be coupled to the via. The metal line may be interposed between the semiconductor substrate and the support substrate.

The semiconductor substrate may include an insulation layer interposed between the upper circuit and the lower circuit. The alignment key may vertically penetrate the insulation layer.

Embodiments are also directed to a method of fabricating a semiconductor device including providing a semiconductor substrate having a first surface and a second surface opposite the first surface, forming a field region extending from the first surface through the semiconductor substrate toward the second surface without reaching the second surface, forming an alignment key and a connection contact that penetrate through the field region from the first surface toward the second surface without reaching the second surface, forming a first circuit on the first surface of the semiconductor substrate such that the first circuit is electrically connected to the connection contact, forming a support substrate on the first circuit, recessing the second surface of the semiconductor substrate to form a third surface exposing the field region, the alignment key, and the connection contact, and forming a second circuit on the third surface of the semiconductor substrate such that the second circuit is electrically connected to the connection contact.

The method may further include, after forming the first substrate and before recessing the second surface of the semiconductor substrate, turning the semiconductor substrate upside down.

The method may further include forming a metal line between the first circuit and the support substrate, forming a via penetrating the support substrate and contacting the metal line, and forming a metal pad on the support substrate.

Forming the first circuit may include forming a metal line in the first circuit and forming an insulating layer over the metal line. The method may further include removing the support substrate, forming a via penetrating the insulating layer and contacting the metal line, and forming a metal pad on the insulating layer.

One of the first and the second circuit includes a cell array including a cell transistor and the other of the first and the second circuit includes a peripheral circuit including a peripheral transistor.

Embodiments are also directed to a semiconductor device including a semiconductor substrate having a first surface and a second surface opposite the first surface, a cell array including a cell transistor on the first surface of the semiconductor substrate, a peripheral circuit including a peripheral transistor on the second surface of the semiconductor substrate, an alignment key that extends from the first surface to the second surface such that the alignment key vertically aligns the cell array with the peripheral circuit, and a connection contact that extends from the first surface to the second surface such that the connection contact electrically connects the cell array to the peripheral circuit. The cell transistor and the peripheral transistor are vertically symmetric with respect to the semiconductor substrate.

The cell array may further include a bit line electrically connected to the cell transistor. The peripheral circuit may further include a metal line electrically connected to the peripheral transistor, the connection contact electrically connecting the bit line to the metal line.

The cell array may further include a capacitor on the cell transistor, the capacitor being electrically connected to the cell transistor.

The semiconductor device may further include a support substrate on the peripheral circuit, a via that penetrates the support substrate to be electrically connected to the metal line, and an external terminal on the support substrate, the external terminal being electrically connected to the via.

The metal line may be more adjacent to the support substrate rather than the semiconductor substrate.

The semiconductor may include an insulation layer between the cell array and the peripheral circuit, at least one of the alignment key and the connection contact vertically penetrating the insulation layer.

The peripheral circuit may further include a via that partially penetrates to be in contact with the metal line and an external terminal electrically connected to the via.

Embodiments are also directed to a semiconductor device including a semiconductor substrate having an upper surface and a lower surface opposite the upper surface, a field region that extends from the upper surface through the semiconductor substrate to the lower surface, an insulative alignment key that penetrates through the field region from the upper surface to the lower surface, a conductive connection contact that penetrates through the field region from the upper surface to the lower surface, a first circuit on the upper surface of the semiconductor substrate such that the first circuit is electrically connected to the connection contact, and a second circuit on the lower surface of the semiconductor substrate such that the second circuit is electrically connected to the connection contact. The alignment key vertically aligns the first circuit with the second circuit.

One of the first circuit and the second circuit may include a cell array including a cell transistor and another of the first circuit and the second circuit includes a peripheral circuit including a peripheral transistor. The cell transistor and the peripheral transistor may be symmetric with respective to the semiconductor substrate.

The cell array may further include a bit line and a capacitor that are electrically connected to the cell transistor.

The semiconductor device may further include a support substrate on the peripheral circuit, a via that penetrates the support substrate and is electrically connected to the metal line, and an external terminal on the support substrate, the external terminal electrically connected to the via.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
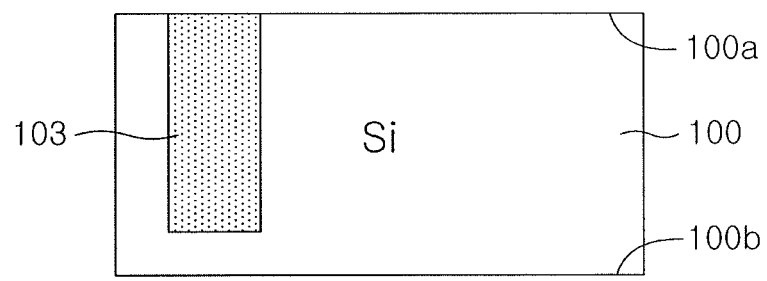
FIGS. 1A to 1E illustrate cross sectional views depicting stages of a method of fabricating a semiconductor device according to embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIGS. 1A to 1E illustrate cross sectional views depicting stages of a method of fabricating a semiconductor device according to embodiments. FIG. 1F illustrates a cross sectional view of a portion of FIG. 1E. FIGS. 1G and 1H illustrate cross sectional views depicting modified examples of FIG. 1E.

Referring to FIG. 1A, a field region 103 may be formed in a semiconductor substrate 100 having a first surface 100a and a second surface 100b opposite the first surface 100a. The semiconductor substrate 100 may be a substrate including silicon. The field region 103 may have a trench shape that is filled with an insulator and that extends from the first surface 100a toward the second surface 100b. The field region 103 may be configured to not reach the second surface 100b of the semiconductor substrate 100.

Figure 1B:
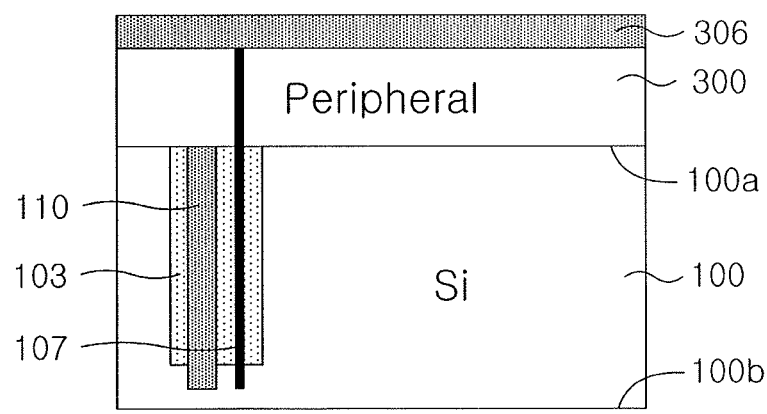

Referring to FIG. 1B, a peripheral circuit 300 may be formed on the first surface 100a of the semiconductor substrate 100. The peripheral circuit 300 may include a metal line 306. During the formation of the peripheral circuit 300, an alignment key 110 and a connection contact 107 that vertically penetrate the field region 103 may be formed. The alignment key 110 and the connection contact 107 may extend from the first surface 100a toward the second surface 100b. The alignment key 110 and the connection contact 107 may be configured to not reach the second surface 100b. The connection contact 107 may be coupled to the metal line 306 to be electrically connected with the peripheral circuit 300. The alignment key 110 may include an insulator such that the alignment key 110 is not electrically connected to the peripheral circuit 300.

Figure 1C:
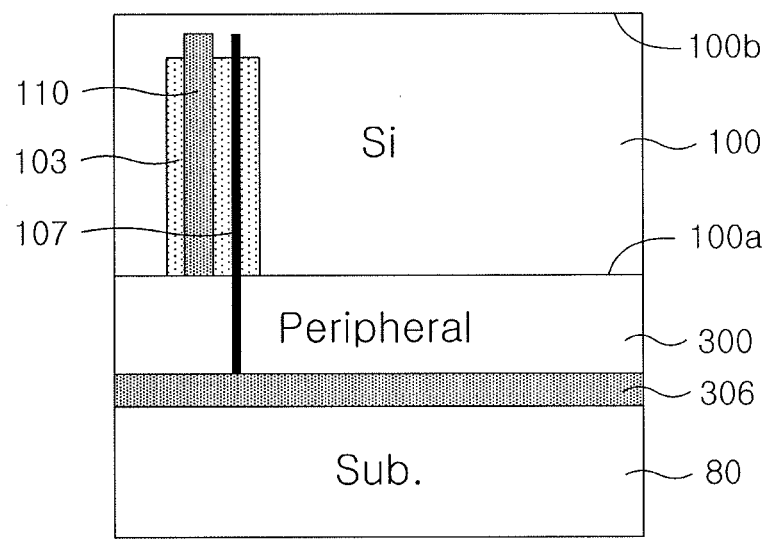

Referring to FIG. 1C, a support substrate 80 may be attached to the peripheral circuit 300, and the semiconductor substrate 100 may be turned upside down. The peripheral circuit 300 and the semiconductor substrate 100 may be sequentially stacked in an inverted state on the support substrate 80. The metal line 306 of the peripheral circuit 300 may be adjacent to the support substrate 80, and the second surface 100b of the semiconductor substrate 100 may face upward. The support substrate 80 may include any suitable material. For example, the support substrate 80 may be a silicon substrate or non-silicon substrate, such as a glass or polymer substrate.

Figure 1D:
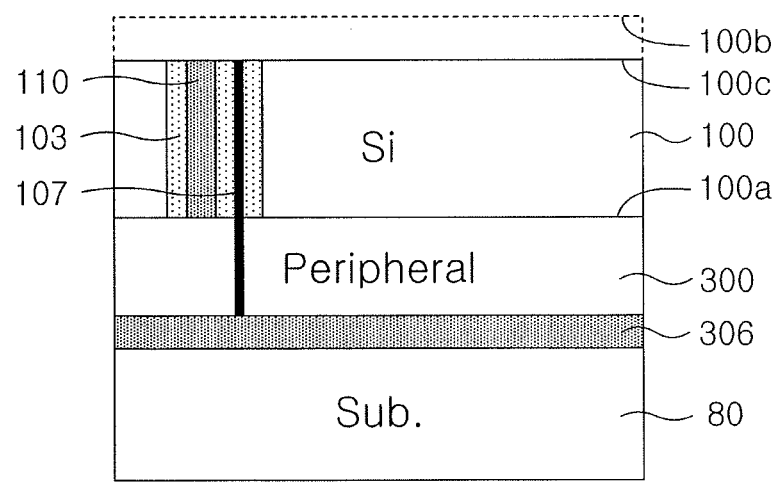

Referring to FIG. 1D, the second surface 100b of the semiconductor substrate 100 may be recessed to form an exposed third surface 100c. For example, the second surface 100b may be recessed by a chemical mechanical polishing process, a grinding process, or an etch-back process under a state in which the semiconductor substrate 100 is supported by the support substrate 80. The alignment key 110 and the connection contact 107 may be exposed through the third surface 100c. The field region 103 may be exposed through the third surface 100c or may be not exposed.

Figure 1E:
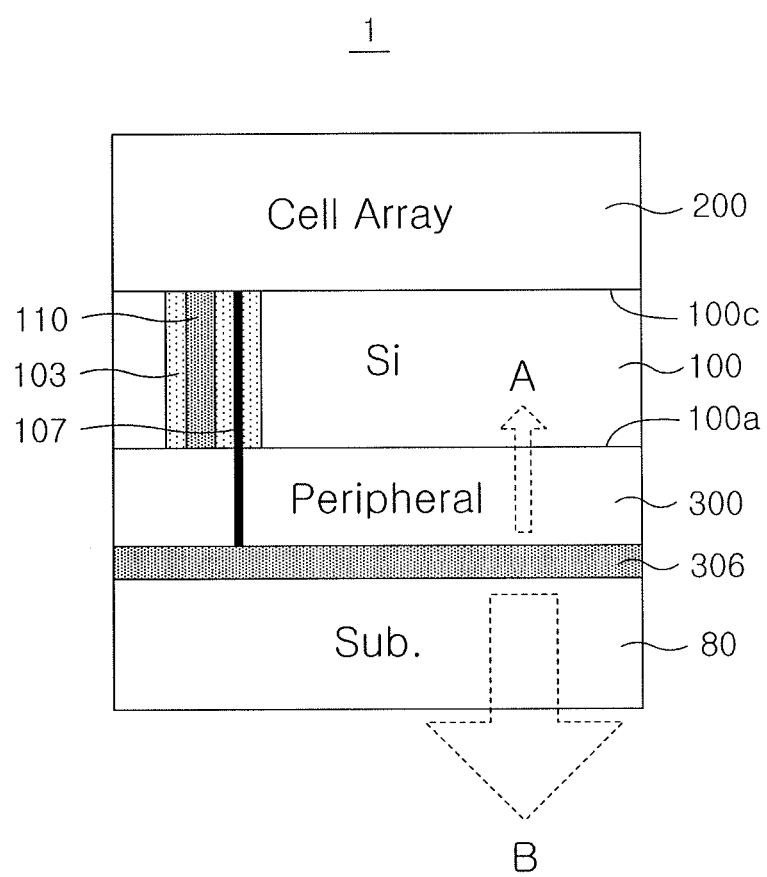
Figure 1F:
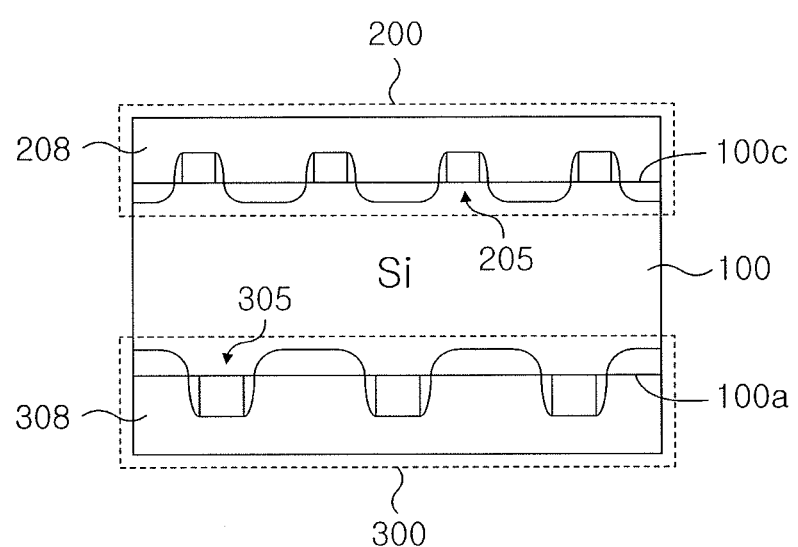
FIG. 1F illustrates a cross sectional view of a portion of FIG. 1E.
Figure 1G:
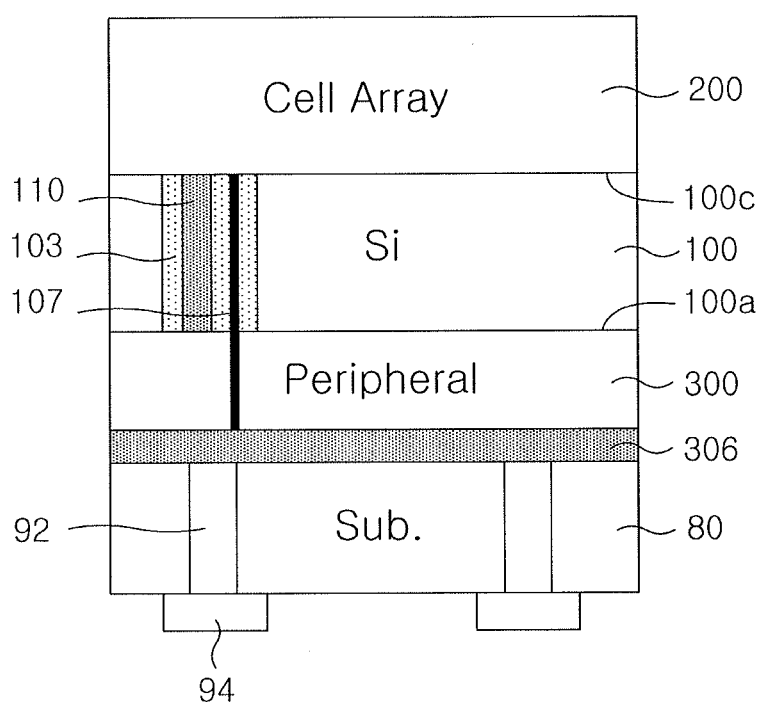
FIGS. 1G and 1H illustrate cross sectional views depicting modified examples of FIG. 1E.
Figure 1H:
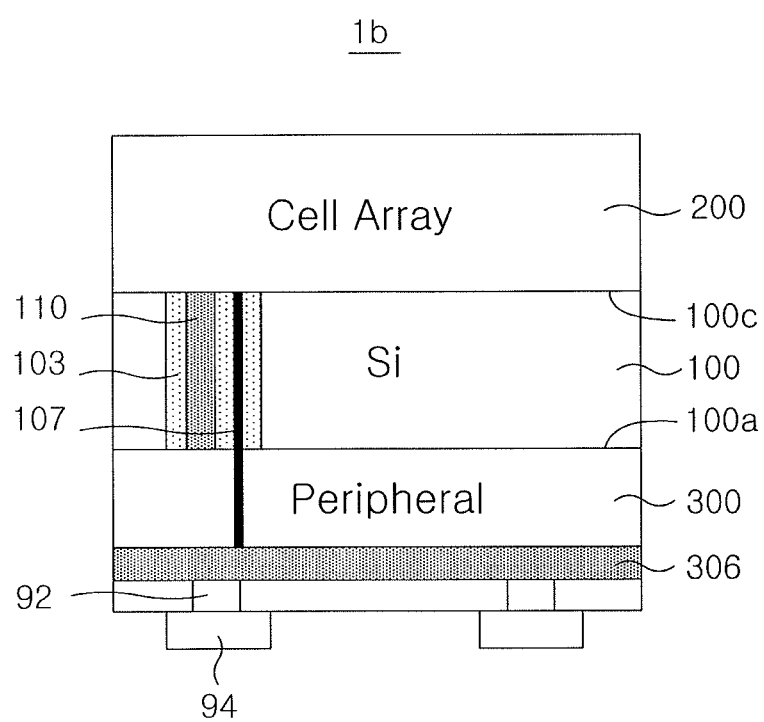

Referring to FIG. 1E, a cell array 200 may be formed on the third surface 100c of the semiconductor substrate 100 to be electrically connected to the connection contact 107. The cell array 200 may include a memory circuit such as DRAM or FLASH, a logic circuit such as CPU or AP, a photodiode of CMOS image sensor, as examples. The cell array 200 may be vertically aligned with the peripheral circuit 300 by the alignment key 110, and may be electrically connected to the peripheral circuit 300 by the connection contact 107. Through the processes described above, a semiconductor device 1 including the peripheral circuit 300 on the first surface 100a and the cell array 200 on the third surface 100c may be fabricated. The semiconductor device may constitute a COP (cell on peripheral) structure where the cell array 200 is stacked over the peripheral circuit 300 on the support substrate 80.

The metal line 306 may be interposed between the support substrate 80 and the semiconductor substrate 100 such that the metal line 306 is closer to the support substrate 80. Heat generated from the semiconductor device 1 may be more favorably transferred toward the support substrate 80 through the metal line 306 along a B direction than toward the cell array 200 along an A direction. The support substrate 80 may be used as a heat sink. Accordingly, most of heat generated from the semiconductor device 1 may be discharged toward the support substrate 80 such that the cell array 200 and the peripheral circuit 300 may avoid malfunction due to thermal stress.

According to some implementations, the cell array 200 may be formed separately from the peripheral circuit 300. Accordingly, process recipes for each of the cell array 200 and the peripheral circuit 300 may be adjusted properly to their respective characteristics, such as design rule, heat budge, deposition condition, and so forth.

Referring to FIG. 1F, the cell array 200 may include at least one cell transistor 205 covered with an insulation layer 208 and the peripheral circuit 300 may include at least one peripheral transistor 305 covered with an insulation layer 308. The cell transistor 205 may have a structure in an inverse relation to a structure of the peripheral transistor 305. The cell transistor 205 on the third surface 100c of the semiconductor substrate 100 may face upward, and the peripheral transistor 305 on the first surface 100a of the semiconductor substrate 100 may face downward. The cell transistor 205 and the peripheral transistor 305 may be vertically symmetric. Herein, the term "symmetric" refers to being arranged in a back-to-back configuration. For example, the term "symmetric refers to a configuration in which bottom portions of the cell array 200 and the peripheral circuit 300, defined by a direction of forming, face in a direction toward each other on the respective third surface 100c and first surface 100a of the semiconductor substrate 100, and top portions of the cell array 200 and the peripheral circuit 300, defined by a direction of forming, face in a direction away from each other.

Referring to FIG. 1G, according to an implementation, a semiconductor device 1a may be formed to further include a via 92 penetrating the support substrate 80 to be coupled to the metal line 306 and a pad 94 on the support substrate 80 to be coupled to the via 92. In the semiconductor device 1a, heat may be preferentially transferred toward the support substrate 80. Any external apparatus, such as printed circuit board or another semiconductor device, may be coupled to the pad 94 which electrically connects the external apparatus with the semiconductor device 1a.

Referring to FIG. 1H, according to an implementation, the support substrate 80 may be removed. A semiconductor device 1b may be fabricated by forming a via 92 that penetrates the insulation layer (308 of FIG. 1F) of the peripheral circuit 300 and forming a pad 94 coupled to the via 92 on the insulation layer 308.

Figure 2A:
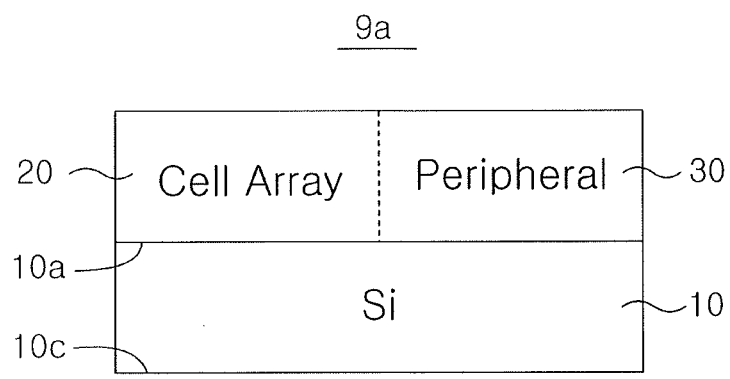
FIGS. 2A to 2C illustrate cross sectional views depicting comparative semiconductor devices having different structures from the embodiments.
Figure 2B:
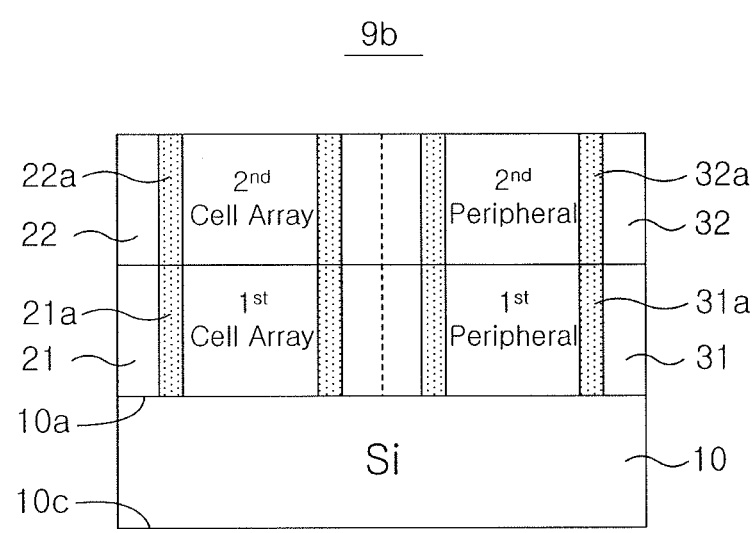
Figure 2C:
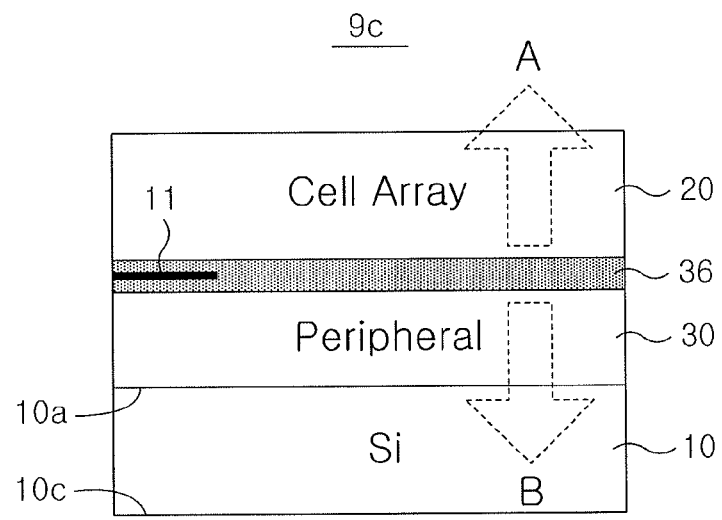
Figure 2D:
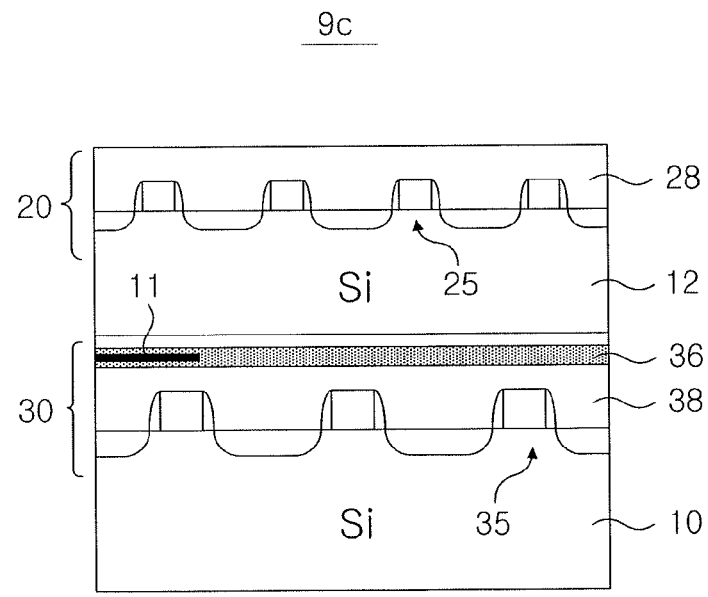
FIG. 2D illustrates a cross sectional view of a portion of FIG. 2C.

FIGS. 2A to 2C illustrate cross sectional views depicting comparative semiconductor devices having different structures from the embodiments. FIG. 2D illustrates a cross sectional view of a portion of FIG. 2C.

Referring to FIG. 2A, a semiconductor 9a may include a cell array 20 and a peripheral circuit 30 that are provided on a first surface 10a of a semiconductor substrate 10. According to embodiments, on the other hand, the cell array 300 is provided on the first surface 100a of the semiconductor substrate 100 and the peripheral circuit 300 is disposed on the third 100c of the semiconductor substrate 100 as illustrated in FIG. 1E. In the embodiment illustrated in FIG. 1E, the cell array 200 and the peripheral circuit 300 may have increased number of net die and/or may have a decreased area compared to the cell array 20 and the peripheral circuit 30 illustrated in FIG. 2A.

For example, the cell array 200 according to embodiments may have about 2 times an amount of integration, about 2 times a number of net die, or half an area compared to the cell array 20. Similarly, the peripheral circuit 300 may have about 2 times an amount of integration, about 2 times a number of net die, or half an area compared to the peripheral circuit 30.

Referring to FIG. 2B, a semiconductor device 9b may include a first cell array 21 and a first peripheral circuit 31 that are arranged horizontally on the first surface 10a of the semiconductor substrate 10, and a second cell array 22 and a second peripheral circuit 32 that are vertically stacked on the first cell array 21 and the first peripheral circuit 31, respectively. In this structure, it may be additionally necessary to form or attach a single crystalline semiconductor layer for the second cell array 22 and the second peripheral circuit 32. Moreover, it may be additionally necessary to form a plurality of through electrodes 21a and 22a to electrically connect the first cell array 21 to the second cell array 22, and a plurality of through electrodes 31a and 32a to electrically connect the first peripheral circuit 31 to the second peripheral circuit 32. According to embodiments, on the other hand, the peripheral circuit 300 and the cell array 200 are formed on the first and second surfaces 100a and 100b of the semiconductor substrate 100, respectively, as illustrated in FIG. 1E. Accordingly, it is not necessary to form or attach a single crystalline semiconductor layer or to form a plurality of through electrodes.

Referring to FIG. 2C, a semiconductor device 9c may include a peripheral circuit 30 and a cell array 20 that are stacked in the foregoing sequence or reversely on the first surface 10a of the semiconductor substrate 10. In this structure, it may be necessary to form or attach a single crystalline semiconductor layer 12 on the peripheral circuit 30 in order to form the cell array 20, as illustrated in FIG. 2D. Moreover, it may be necessary to form an alignment key 11 after the formation or attachment of the single crystalline semiconductor layer 12. According to embodiments, on the other hand, the peripheral circuit 300 and the cell array 200 are separately formed on the first and second surfaces 100a and 100b of the semiconductor substrate 100, respectively, as illustrated in FIG. 1E. Accordingly, it is not necessary to form or attach a single crystalline semiconductor layer. As illustrated in FIG. 2C, a metal line 36 may be interposed between the peripheral circuit 30 and the cell array 20 such that heat may be transferred toward the cell array 20 along an A direction and the peripheral circuit 30 along a B direction. Consequently, the semiconductor device 9c may suffer from thermal stress applied to the cell array 20 and the peripheral circuit 30, compared to the semiconductor device 1 according to embodiments, having the support substrate 80 served as a heat sink.

In the semiconductor device 9c, as illustrated in FIG. 2D, the cell array 20 may include at least one cell transistor 25 covered with an insulation layer 28, and the peripheral circuit 30 may include at least one peripheral transistor 35 covered with an insulation layer 38. Since the cell array 20 is vertically stacked on the peripheral circuit 30, the peripheral transistor 35 may face upward on the semiconductor substrate 10 and the cell transistor 35 may face upward on the single crystalline semiconductor layer 12. In other words, the cell transistor 25 and the peripheral transistor 35 may be arranged in a back-to-front configuration differently from the back-to-back configuration according to embodiments.

FIGS. 3A to 3G illustrate cross sectional views depicting stages of a method of fabricating a semiconductor device according to embodiments.

Figure 3A:
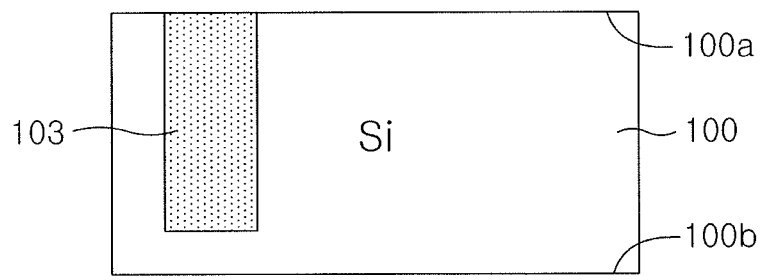
FIGS. 3A to 3G illustrate cross sectional views depicting stages of a method of fabricating a semiconductor device according to embodiments.

Referring to FIG. 3A, the semiconductor substrate 100 having the first surface 100a and the second surface 100b opposite the first surface 100a may be provided. The field region 103 may be formed in the semiconductor substrate 100.

Figure 3B:
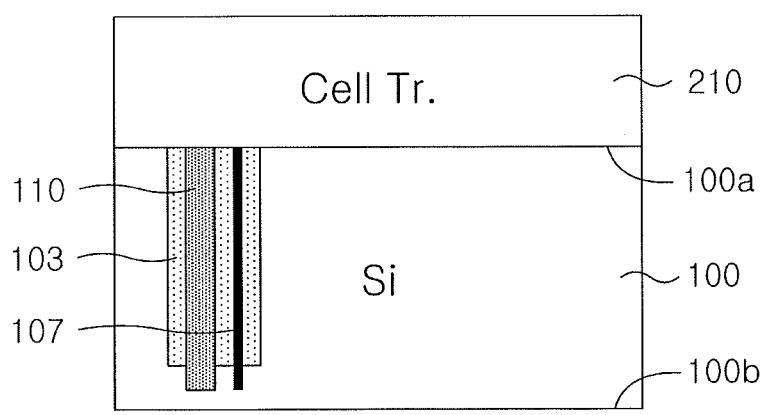

Referring to FIG. 3B, a cell transistor layer 210 having cell transistors may be formed on the first surface 100a of the semiconductor substrate 100. When the cell transistor layer 210 is formed, the alignment key 110 and the connection contact 107 may be formed to vertically penetrate the field region 103. The alignment key 110 and the connection contact 107 may vertically extend from the first surface 100a toward the second surface 100b. The alignment key 110 and the connection contact 107 may be configured to not reach the second surface 100b. The connection contact 107 may be electrically connected to the cell transistor layer 210.

Figure 3C:
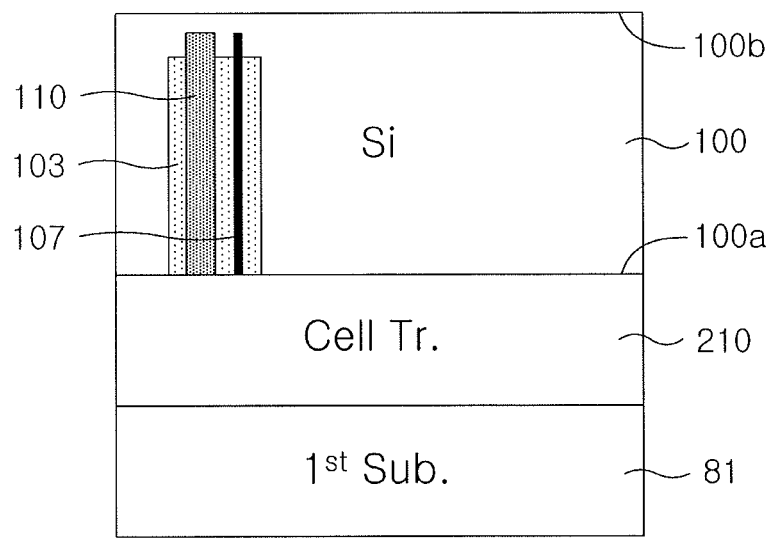

Referring to FIG. 3C, a first support substrate 81 may be attached to the cell transistor layer 210, and the semiconductor substrate 100 may be turned upside down. The cell transistor layer 210 and the semiconductor substrate 100 may be sequentially stacked in an inverted state on the first support substrate 81. The first support substrate 81 may include any suitable material. For example, the first support substrate 81 may be a silicon substrate or non-silicon substrate (e.g., glass or polymer substrate).

Figure 3D:
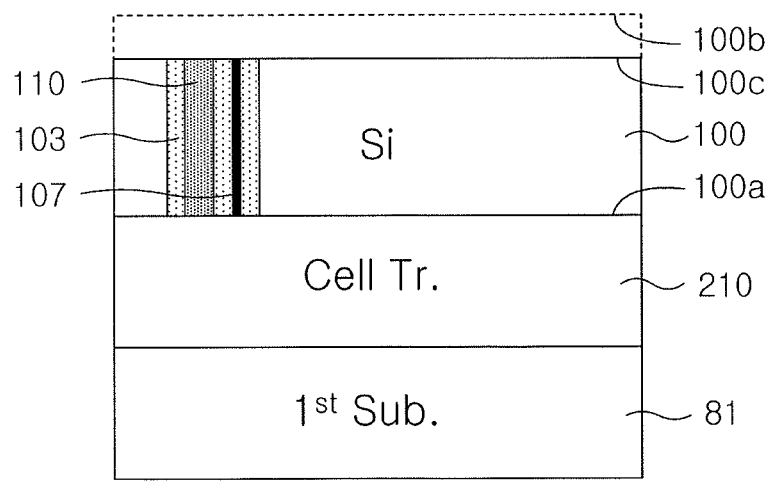

Referring to FIG. 3D, the second surface 100b of the semiconductor substrate 100 may be recessed to form the exposed third surface 100c. For example, the second surface 100b may be recessed under a state that the semiconductor substrate 100 is supported by the first support substrate 81. The alignment key 110 and the connection contact 107 may be exposed through the third surface 100c.

Figure 3E:
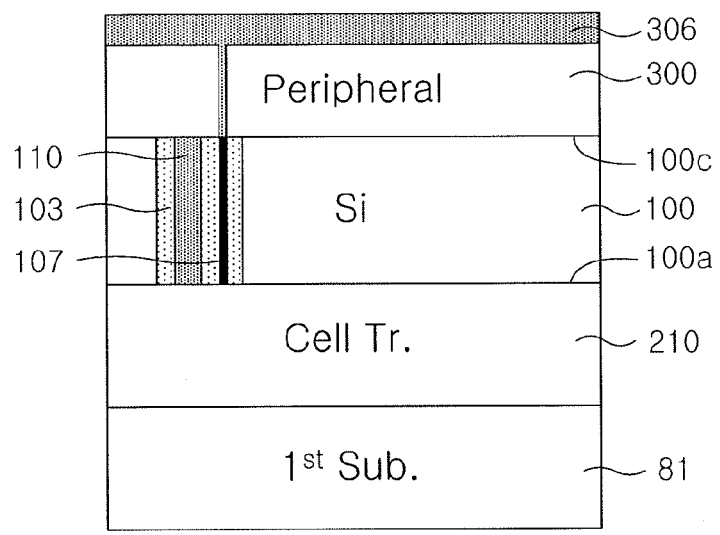

Referring to FIG. 3E, the peripheral circuit 300 may be formed on the third surface 100c of the semiconductor substrate 100 to be electrically connected to the connection contact 107. The peripheral circuit 300 may be aligned with the cell transistor layer 210 by the alignment key 110. The peripheral circuit 300 may further include the metal line 306 electrically connected to the connection contact 107. The peripheral circuit 300 may be electrically connected to the cell transistor layer 210 by the connection contact 107.

Figure 3F:
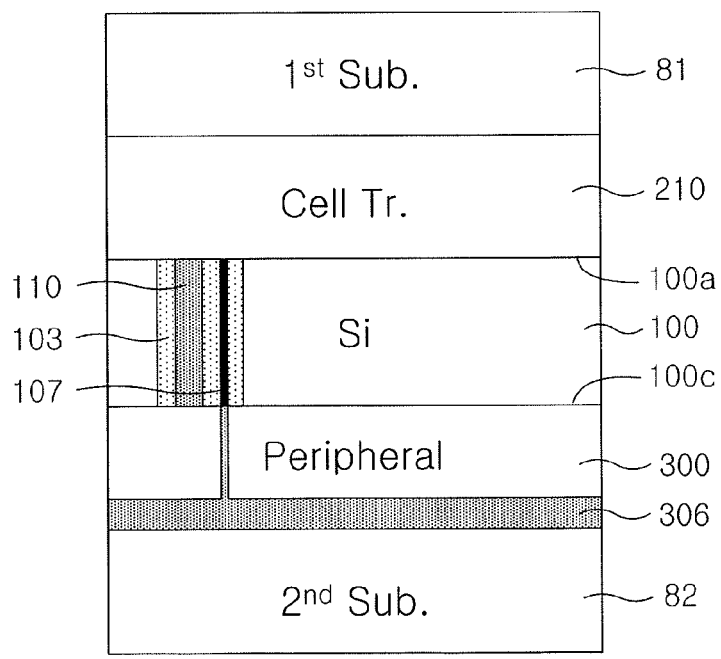

Referring to FIG. 3F, a second support substrate 82 may be attached to the peripheral circuit 300, and the semiconductor substrate 100 may be turned upside down again. The metal line 306 may be interposed between the second support substrate 82 and the semiconductor substrate 100. The second support substrate 82 may include any suitable material. For example, the second support substrate 82 may be a silicon substrate or non-silicon substrate (e.g., glass or polymer substrate). The first support substrate 81 may be removed.

Figure 3G:
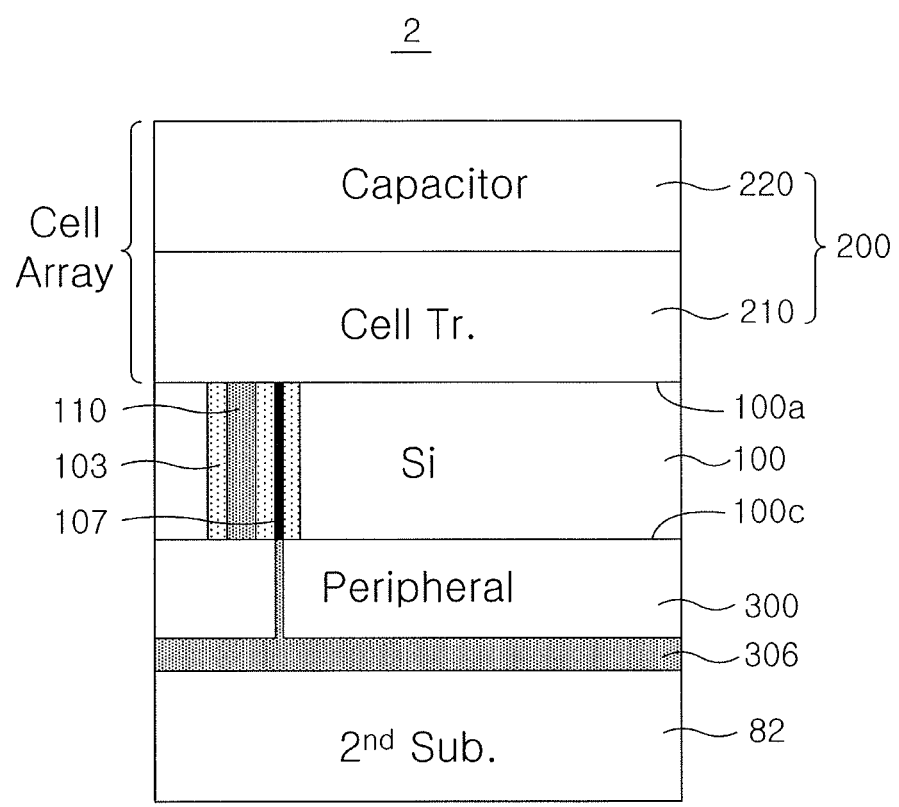

Referring to FIG. 3G, a capacitor layer 220 may be formed on the cell transistor layer 210 to be electrically connected to the cell transistors included in the cell transistor layer 210. The cell array 200 including the cell transistor layer 210 and the capacitor layer 220 may be formed on the first surface 100a of the semiconductor substrate 100. Through the processes described above, a semiconductor device 2 may be fabricated including the peripheral circuit 300 on the first surface 100a and the cell array 200 on the third surface 100c. The semiconductor device 2 may constitute a COP (cell on peripheral) structure where the cell array 200 is stacked over the peripheral circuit 300 on the second support substrate 82.

According to embodiments, the transistor-forming process is performed separately from the capacitor-forming process such that the thermal budget may be suppressed. For example, high temperature processes for forming the cell transistor layer 210 and the peripheral circuit 300 may be followed by a low temperature process for forming the capacitor layer 220, which may suppress or minimize the heat budget to the capacitor.

Moreover, as illustrated in FIG. 1F, the cell transistors of the cell array 200 and peripheral transistors of the peripheral circuit 300 may be arranged in a back-to-back configuration.

FIGS. 4A to 4E illustrate cross sectional views depicting stages of a method of fabricating a semiconductor device according to embodiments.

Figure 4A:
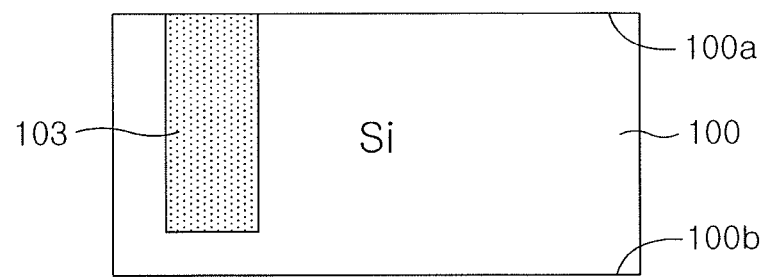
FIGS. 4A to 4E illustrate cross sectional views depicting stages of a method of fabricating a semiconductor device according to embodiments.

Referring to FIG. 4A, the field region 103 may be formed in the semiconductor substrate 100 having the first surface 100a and the second surface 100b facing each other.

Figure 4B:
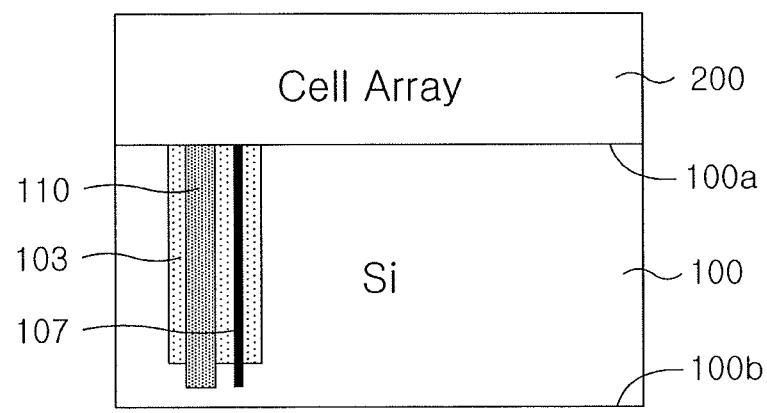

Referring to FIG. 4B, the cell array 200 may be formed on the first surface 100a of the semiconductor substrate 100. The alignment key 110 and the connection contact 107 may be formed to vertically penetrate the field region 103 when the cell array 200 is formed. The alignment key 110 and the connection contact 107 may extend vertically from the first surface 100a toward the second surface 100b. The alignment key 110 and the connection contact 107 may be configured to not reach the second surface 100b. The connection contact 107 may be electrically connected to the cell array 200.

Figure 4C:
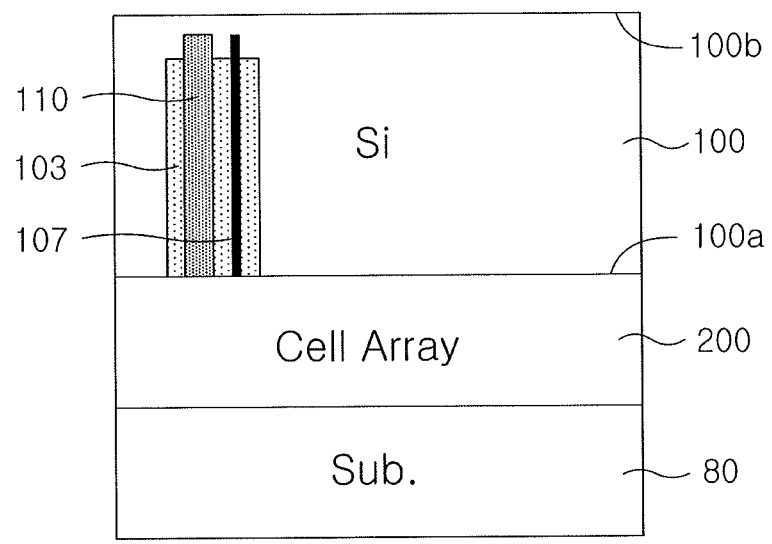

Referring to FIG. 4C, the support substrate 80 may be provided on the cell array 200, and the semiconductor substrate 100 may be turned upside down. The cell array 200 and the semiconductor substrate 100 may be sequentially stacked in an inverted state on the support substrate 80.

Figure 4D:
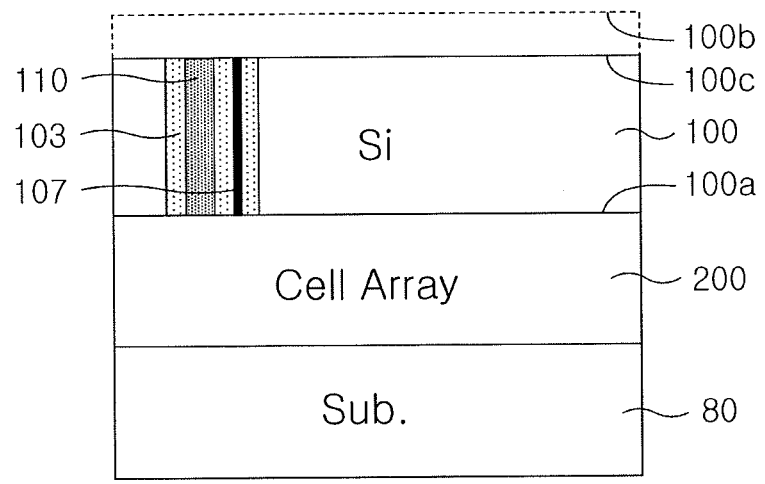

Referring to FIG. 4D, the second surface 100b of the semiconductor substrate 100 may be recessed to form the exposed third surface 100c. For example, the second surface 100b may be subjected to a grinding process in a state in which the semiconductor substrate 100 is supported by the support substrate 80. The alignment key 110 and the connection contact 107 may be exposed through the third surface 100c.

Figure 4E:
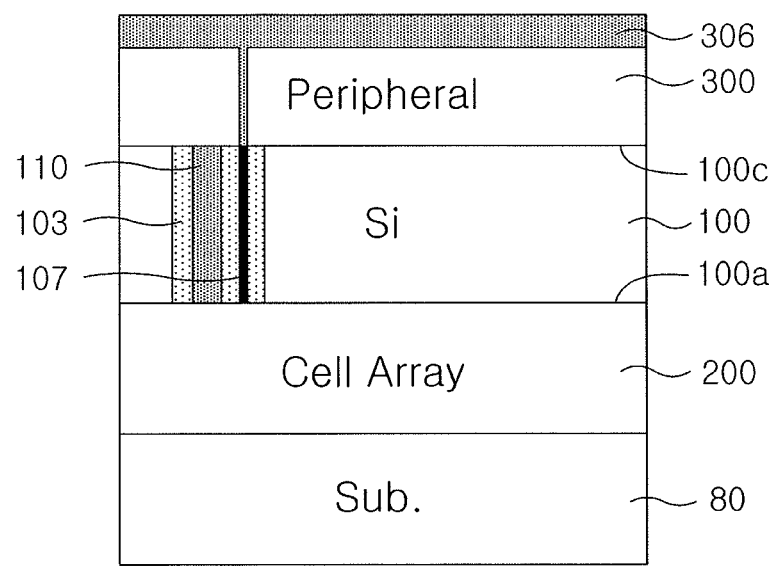

Referring to FIG. 4E, the peripheral circuit 300 may be formed on the third surface 100c of the semiconductor substrate 100 to be electrically connected to the connection contact 107. The peripheral circuit 300 may be aligned with the cell array 200 by the alignment key 110. The peripheral circuit 300 may further include the metal line 306 electrically connected to the connection contact 107. The peripheral circuit 300 may be electrically connected to the cell array 200 by the connection contact 107. Through the processes described above, a semiconductor device 3 may be fabricated including the cell array 200 on the first surface 100a and the peripheral circuit 300 on the third surface 100c. The semiconductor device 3 may constitute a POC (peripheral on cell) structure where the peripheral circuit 300 is stacked over the cell array 200 on the support substrate 80.

In some implementations, the metal line 306 may be provided atop the semiconductor device 3 such that heat may be easily discharged outside the semiconductor device 3. Most of heat generated from the semiconductor device 3 may be moved outside, Accordingly, the cell array 200 and the peripheral circuit 300 may avoid malfunction caused by thermal stress.

FIGS. 5A to 5E illustrate cross sectional views depicting stages of a method of fabricating a semiconductor memory device according to embodiments. FIGS. 5F and 5G illustrate cross sectional views illustrating modified examples of FIG. 5E.

Figure 5A:
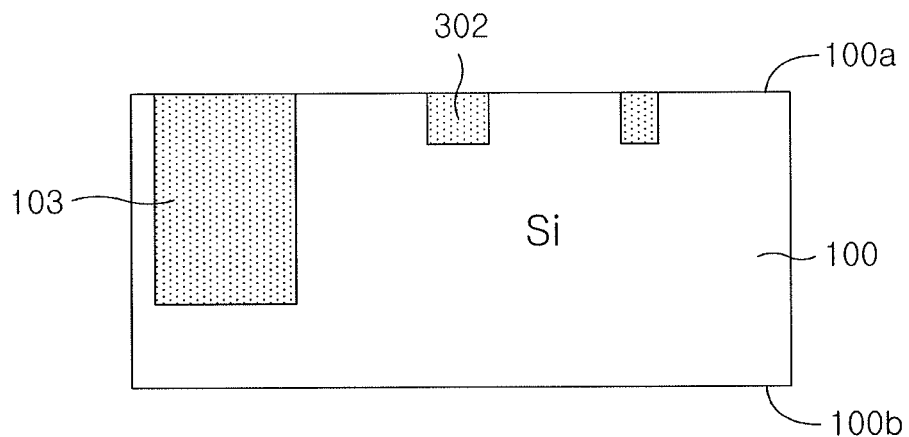
FIGS. 5A to 5E illustrate cross sectional views depicting stages of a method of fabricating a semiconductor memory device according to embodiments.

Referring to FIG. 5A, the field region 103 may be formed in the semiconductor substrate 100 having the first surface 100a and the second surface 100b facing each other. The semiconductor substrate 100 may be a silicon substrate, a single crystalline silicon substrate doped with impurities such as a p-type dopant, or a SOI substrate. A device isolation layer 302 may be further formed simultaneously with the field region 103. Each of the field region 103 and the device isolation layer 302 may have a trench shape that extends from the first surface 100a toward the second surface 100b and that is filled with an insulator. The field region 103 may have a depth greater than that of the device isolation layer 302.

Figure 5B:
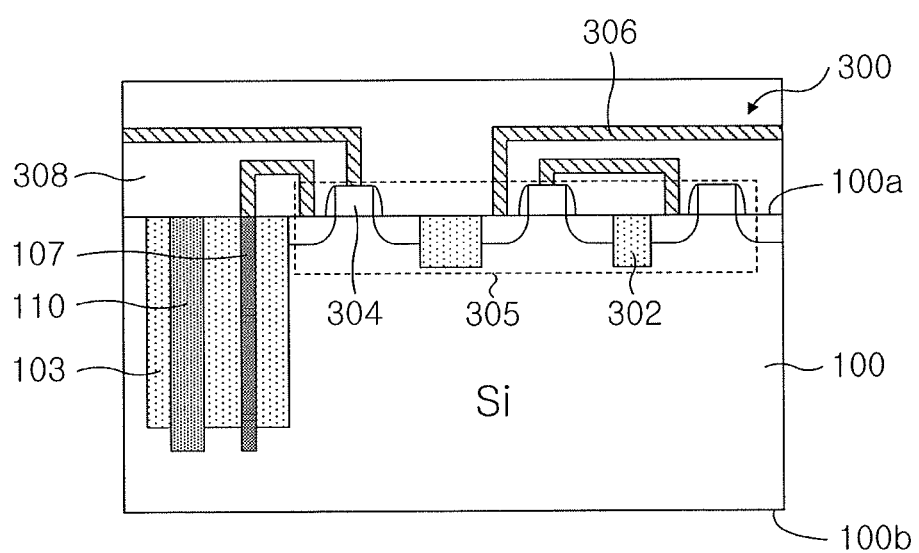

Referring to FIG. 5B, the peripheral circuit 300 may be formed on the first surface 100a of the semiconductor substrate 100. The peripheral circuit 300 may include at least one peripheral transistor 305 including a gate 304 on the first surface 100a, at least one metal line 306 electrically connected to the at least one peripheral transistor 305, and an insulation layer 308 covering the peripheral transistor 305 and the metal line 306. The alignment key 110 and the connection contact 107 may be formed when the peripheral circuit 300 is formed. The alignment key 110 and the connection contact 107 may vertically penetrate the field region 103 to extend from the first surface 100a toward the second surface 100b. The connection contact 107 may be coupled to the peripheral transistor 305 or the metal line 306 to be electrically connected with the peripheral circuit 300. In some implementations, the connection contact 107 may be formed simultaneously with the metal line 306. The alignment key 110 may be formed of an insulator.

Figure 5C:
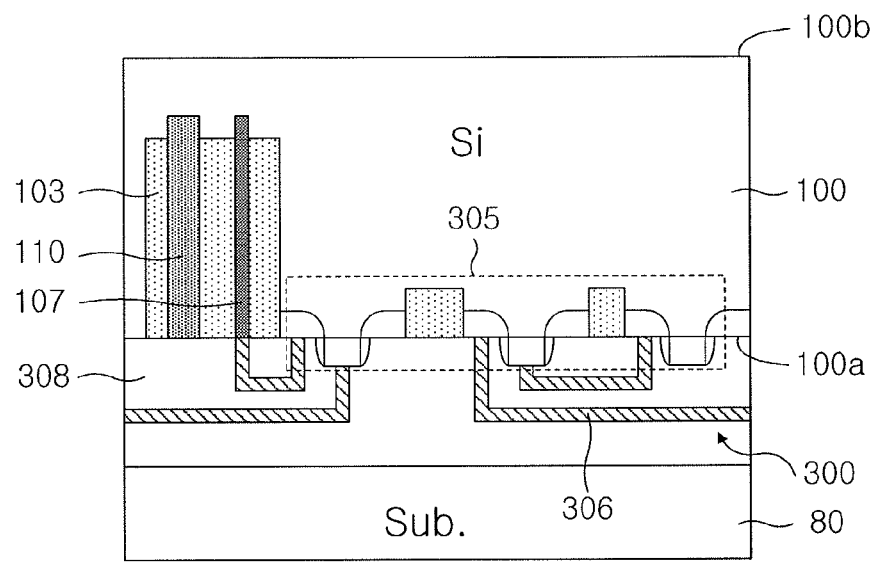

Referring to FIG. 5C, the support substrate 80 may be provided on the peripheral circuit 300, and the semiconductor substrate 100 may be turned upside down. The peripheral circuit 300 and the semiconductor substrate 100 may be sequentially stacked in an inverted state on the support substrate 80. The metal line 306 may be adjacent to the support substrate 80 and face downward, and the second surface 100b of the semiconductor substrate 100 may face upward.

Figure 5D:
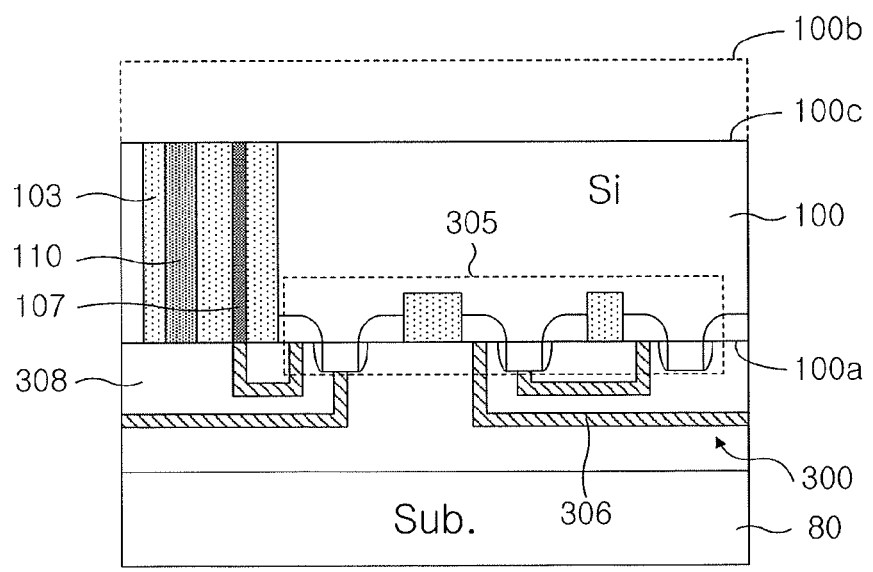

Referring to FIG. 5D, the second surface 100b of the semiconductor substrate 100 may be recessed to form the exposed third surface 100c. For example, the second surface 100b may be recessed by a chemical mechanical polishing process, a grinding process, or an etch-back process under a state that the semiconductor substrate 100 is supported by the support substrate 80. The alignment key 110 and the connection contact 107 may be exposed through the third surface 100c.

Figure 5E:
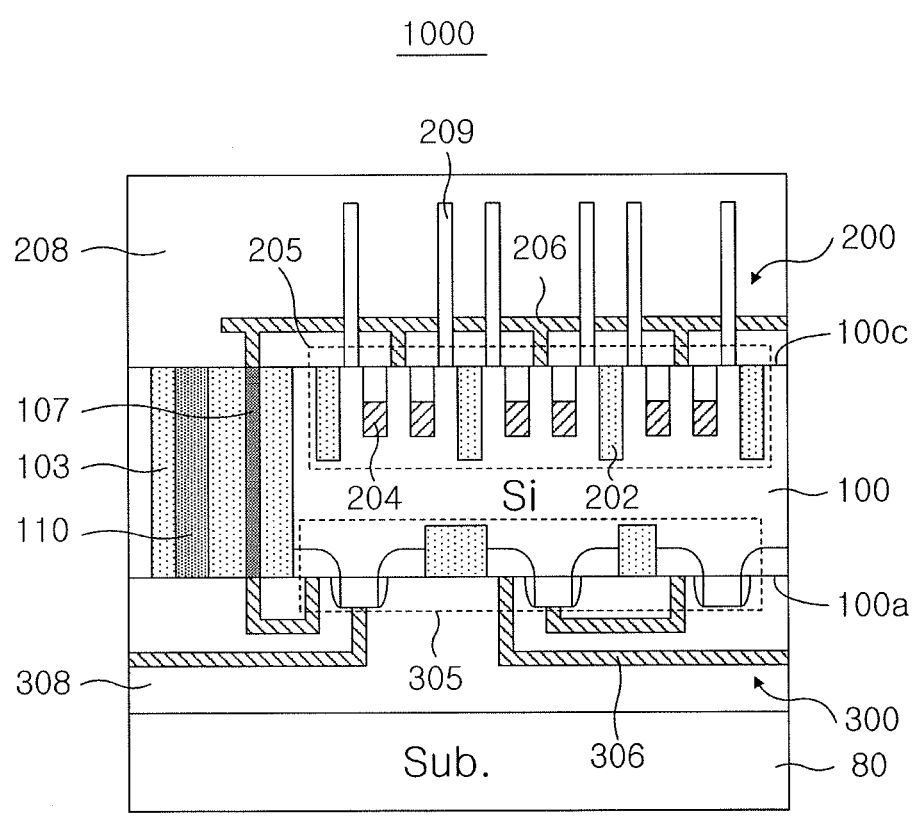
Figure 5F:
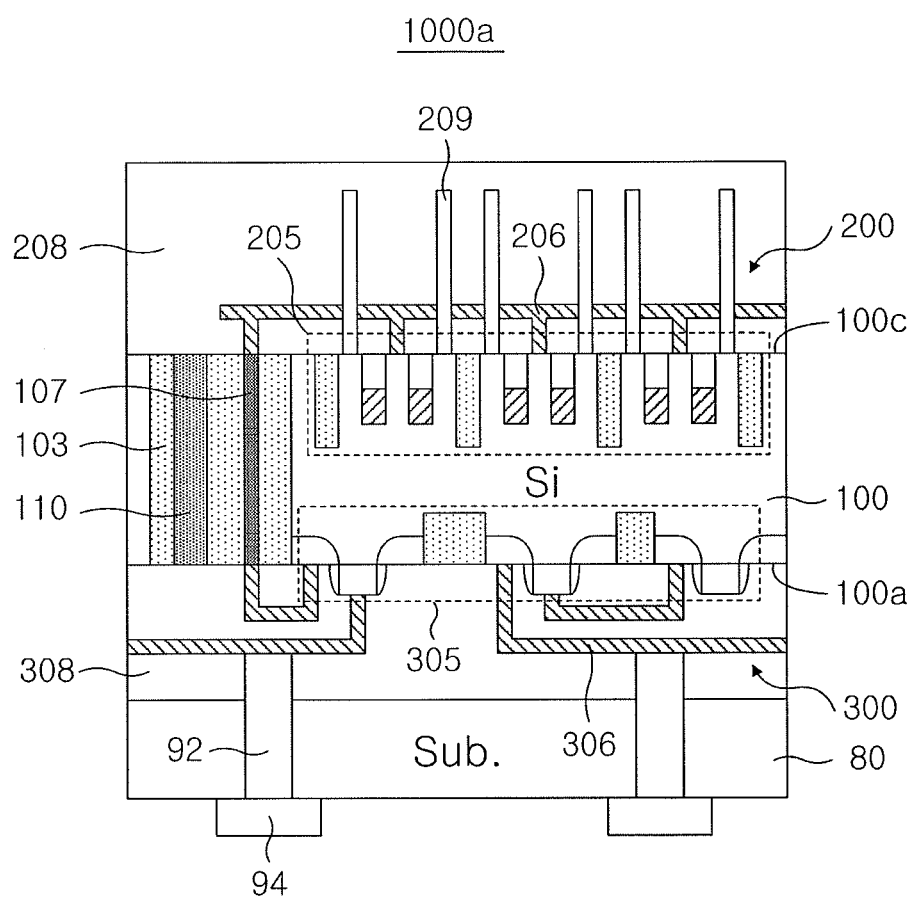
FIGS. 5F and 5G illustrate cross sectional views depicting modified examples of FIG. 5E.
Figure 5G:
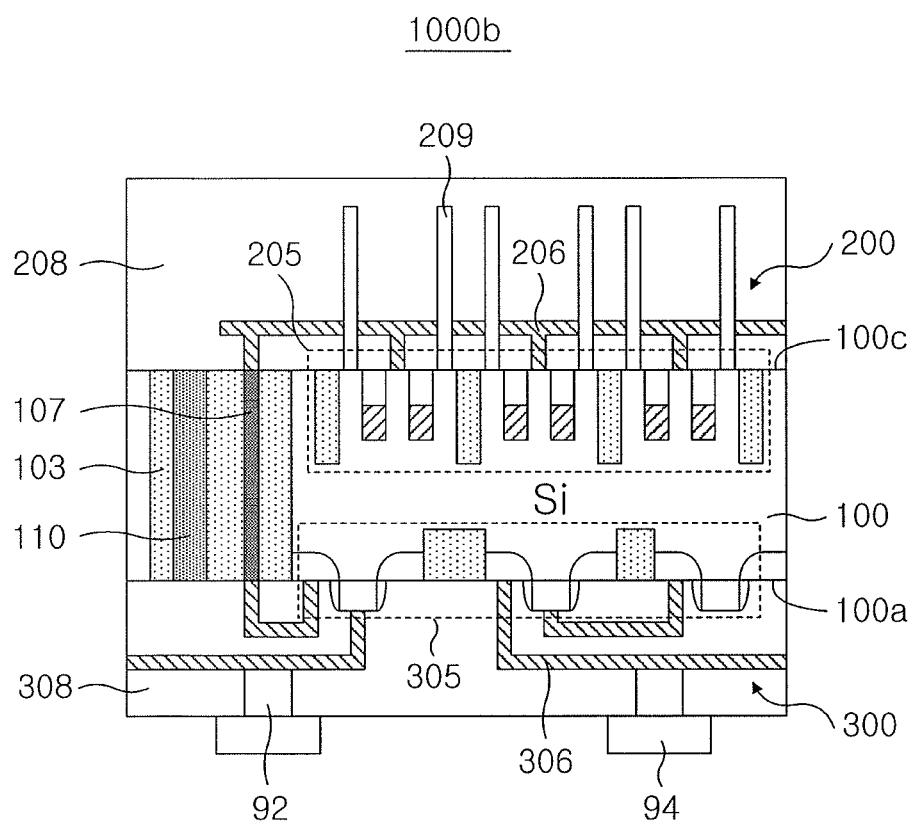

Referring to FIG. 5E, the cell array 200 may be formed on the third surface 100c of the semiconductor substrate 100. The cell array 200 may include at least one cell transistor 205 including a gate 204 recessed under the third surface 100c, at least one device isolation layer 202 under the third surface 100c, at least one bit line 206 and at least one capacitor 209, which are electrically connected to the cell transistor 205, and an insulation layer 208 covering the cell transistor 205, the bit line 206 and the capacitor 209. The cell array 200 may be a memory cell array. The cell array 200 may be aligned with the peripheral circuit 300 by the alignment key 110. The bit line 206 may be coupled to the connection contact 107 to be electrically connected with the cell array 200 and the peripheral circuit 300. In some implementations, the peripheral transistor 305 may be provided on the first surface 100a and the cell transistor 205 may be provided on the third surface 100c. The peripheral transistor 305 and the cell transistor 205 may be arranged in the back-to-back configuration as illustrated in FIG. 1F.

According to some implementations, identical or similar to the descriptions with reference to FIGS. 1A to 1E, a semiconductor memory device 1000 may be fabricated having a COP (cell on peripheral) structure where the cell array 200 is stacked over the peripheral circuit 300 on the support substrate 80. Since the metal line 306 is adjacent to the support substrate 80, the support substrate 80 may serve as a heat sink.

Referring to FIG. 5F, as one modified implementation of the semiconductor memory device 1000, a semiconductor memory device 1000a may be fabricated to further include a via 92 penetrating the support substrate 80 to be coupled to the metal line 306, and a pad 94 on the support substrate 80 to be coupled to the via 92. Heat may be easily discharged toward the support substrate 80 through the via 92.

Referring to FIG. 5G, as another modified implementation of the semiconductor memory device 1000, a semiconductor memory device 1000b may be fabricated to further include a via 92 partially penetrating the insulation layer 308 to be coupled to the metal line 306 and a pad 94 on the insulation layer 308 to be coupled to the via 92. The support substrate 80 may be removed before the via 92 and the pad 94 are formed.

FIGS. 6A to 6G illustrate cross sectional views depicting stages of a method of fabricating a semiconductor memory device according to embodiments. FIGS. 6H and 6I are cross sectional views illustrating modified examples of FIG. 6G.

Figure 6A:
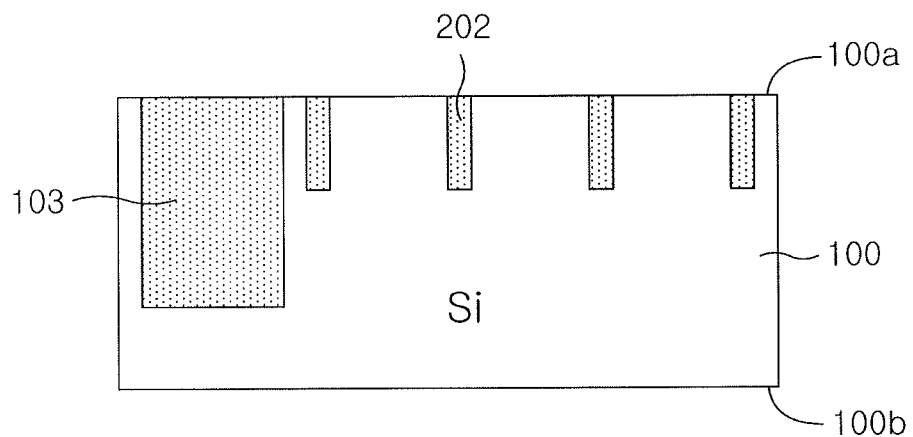
FIGS. 6A to 6G illustrate cross sectional views depicting stages of a method of fabricating a semiconductor memory device according to embodiments.

Referring to FIG. 6A, the field region 103 and a device isolation layer 202 may be provided in the semiconductor substrate 100 having the first surface 100a and the second surface 100b facing each other. The field region 103 may have a depth greater than that of the device isolation layer 202.

Figure 6B:
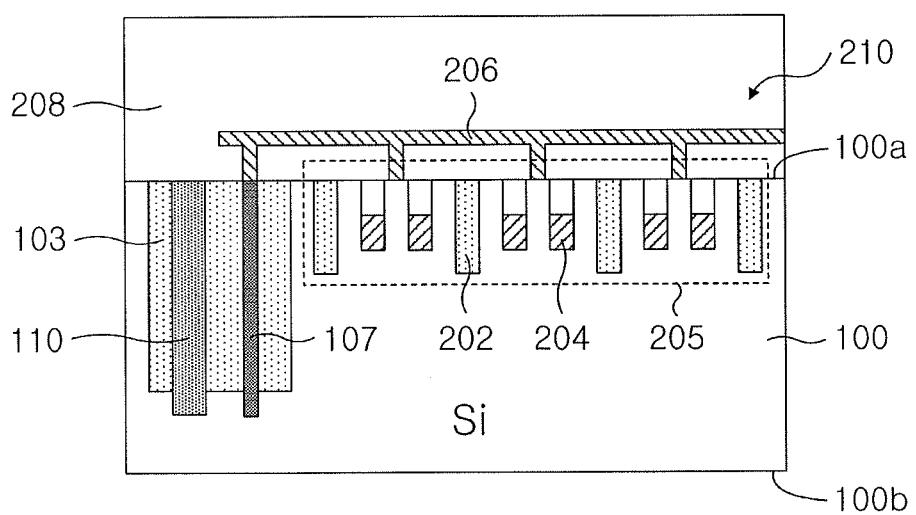

Referring to FIG. 6B, the cell transistor layer 210 may be formed on the first surface 100a of the semiconductor substrate 100. The cell transistor layer 210 may include the cell transistor 205 having the gate 204 recessed under the first surface 100a, the bit line 206 electrically connected to the cell transistor 205, and the insulation layer 208 covering the cell transistor 205 and the bit line 206. The alignment key 110 and the connection contact 107, which vertically penetrate the field region 103, may be formed when the cell transistor layer 210 is formed. The connection contact 107 may be coupled to the bit line 206 to be electrically connected with the cell transistor layer 210. In some implementations, the connection contact 107 may be formed simultaneously with the bit line 206.

Figure 6C:
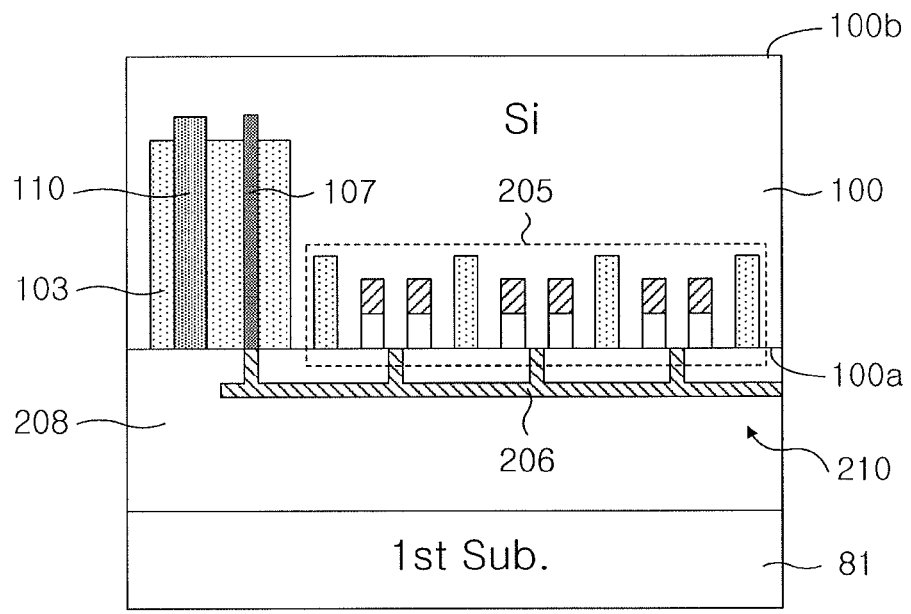

Referring to FIG. 6C, the first support substrate 81 may be attached to the cell transistor layer 210, and the semiconductor substrate 100 may be turned upside down. The cell transistor layer 210 and the semiconductor substrate 100 may be sequentially stacked in an inverted state on the first support substrate 81.

Figure 6D:
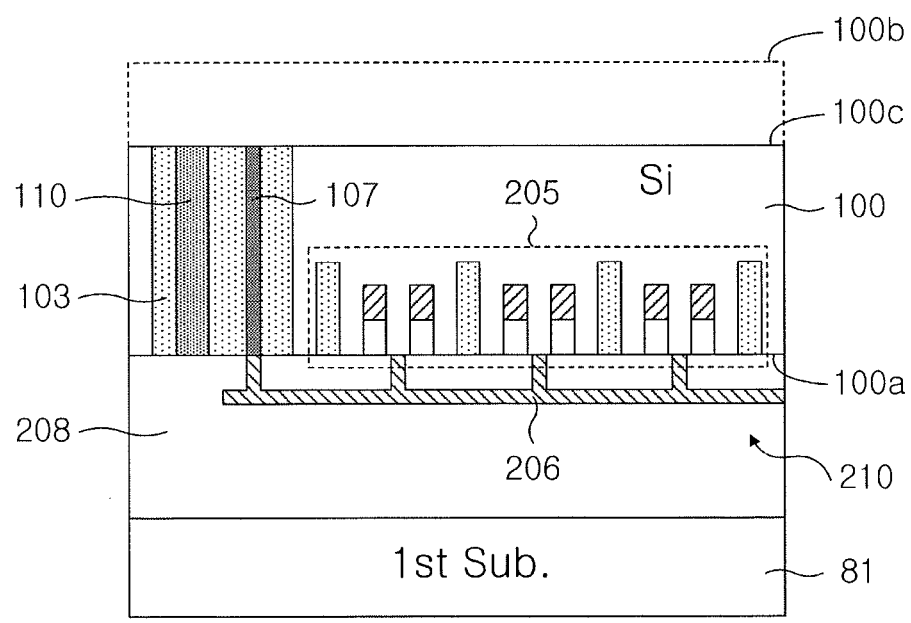

Referring to FIG. 6D, the second surface 100b of the semiconductor substrate 100 may be recessed to form the exposed third surface 100c. For example, the second surface 100b may be recessed under a state that the semiconductor substrate 100 is supported by the first support substrate 81. The alignment key 110 and the connection contact 107 may be exposed through the third surface 100c.

Figure 6E:
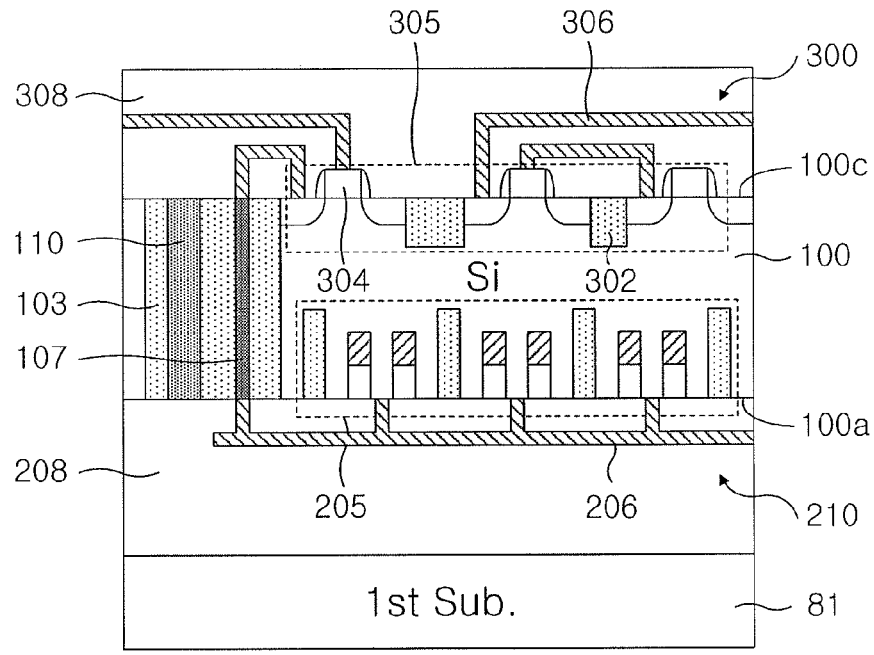

Referring to FIG. 6E, the peripheral circuit 300 may be formed on the third surface 100c of the semiconductor substrate 100 to be electrically connected to the connection contact 107. The peripheral circuit 300 may include the peripheral transistor 305 including the gate 304 on the third surface 100c, the metal line 306 electrically connected to the peripheral transistor 305, and the insulation layer 308 covering the peripheral transistor 305 and the metal line 306. The peripheral circuit 300 may be aligned with the cell transistor layer 210 by the alignment key 110. The metal line 306 may be coupled to the connection contact 107 to be electrically connected with the cell transistor 205. The peripheral circuit 300 may be electrically connected to the cell transistor layer 210 by the connection contact 107.

Figure 6F:
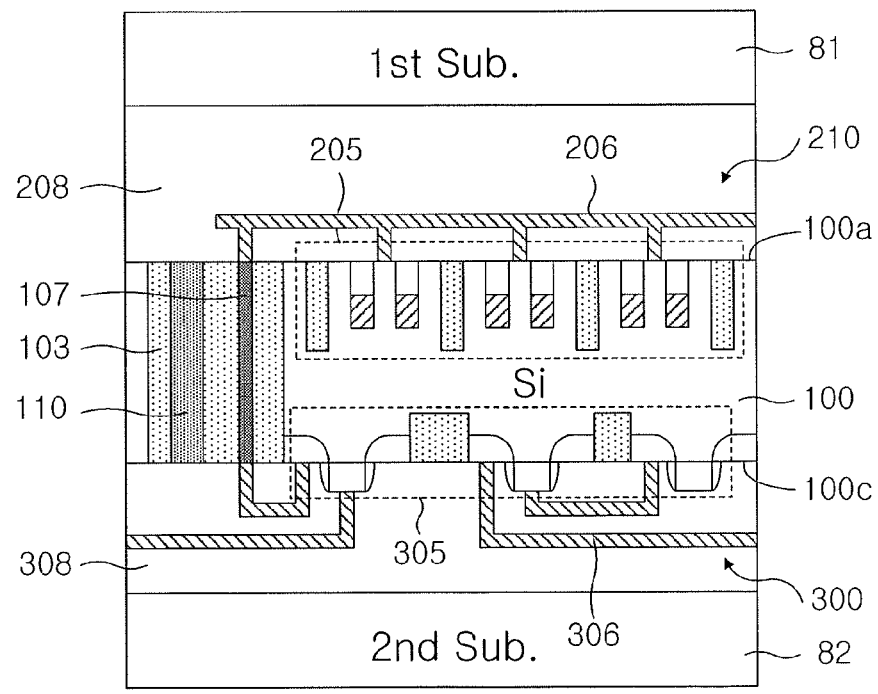

Referring to the FIG. 6F, the second support substrate 82 may be attached onto the peripheral circuit 300, and the semiconductor substrate 100 may be turned upside down again. The metal line 306 may be provided between the semiconductor substrate 100 and the second support substrate 82. The first support substrate 81 may be detached from the cell transistor layer 210.

Figure 6G:
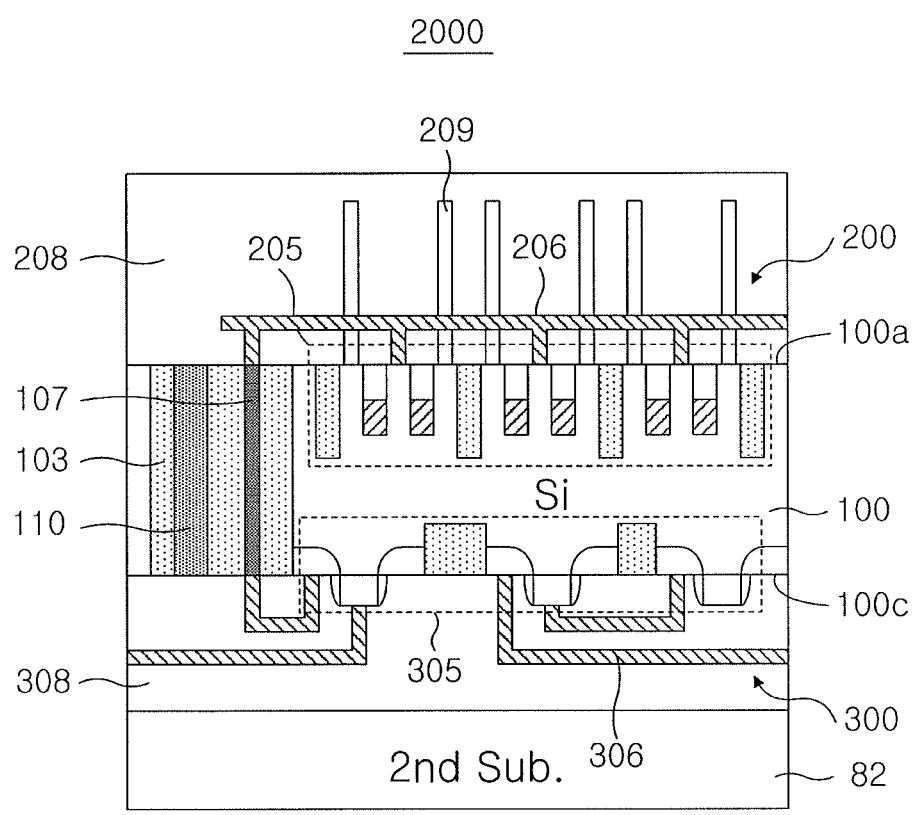
Figure 6H:
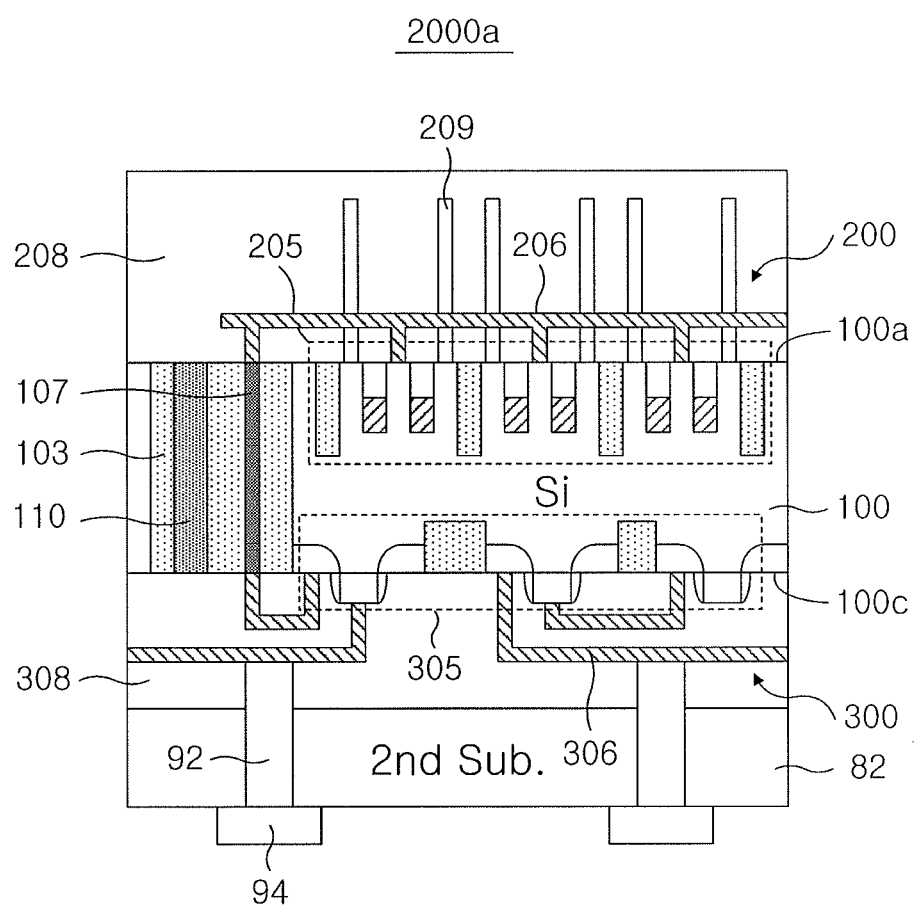
FIGS. 6H and 6I illustrate cross sectional views depicting modified examples of FIG. 6G.
Figure 6I:
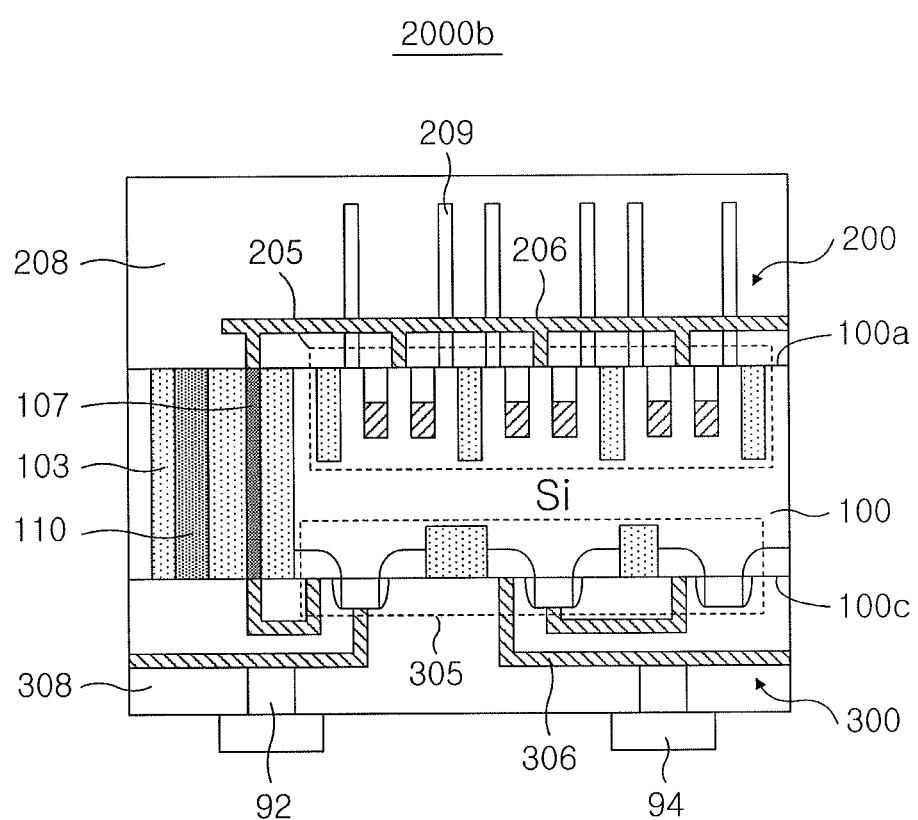

Referring to FIG. 6G, the capacitor 209 may be formed on the first surface 100a to be electrically connected to the cell transistors 205. The cell array 200 such as a memory cell array including the cell transistor 205, the bit line 206, and the capacitor 209 may be formed on the first surface 100a of the semiconductor substrate 100. According to some embodiments, identical or similar to the descriptions with reference to FIGS. 3A to 3G, a semiconductor memory device 2000 may be fabricated including the cell array 200 on the first surface 100a and the peripheral circuit 300 on the third surface 100c. The semiconductor memory device may constitute a COP (cell on peripheral) structure where the cell array 200 is stacked over the peripheral circuit 300 on the second support substrate 82. The semiconductor memory device 2000 may have the substantially same structure of the semiconductor memory device 100 as illustrated in FIG. 5E.

According to some implementations, the high temperature processes for forming the cell transistor 205 and the peripheral transistor 305 may be followed by the low temperature process for forming the capacitor 209, which may suppress or minimize the heat budget applied to the capacitor 209. The cell transistor 205 may be provided on the first surface 100a and the peripheral transistor 305 may be provided on the third surface 100c. The cell transistor 205 and the peripheral transistor 305 may be arranged in the back-to-back configuration as illustrated in FIG. 1F.

Referring to FIG. 6H, as one modified implementation of the semiconductor memory device 2000, a semiconductor memory device 2000a may be fabricated to further include the via 92 penetrating the second support substrate 82 to be coupled to the metal line 306, and the pad 94 on the second support substrate 82 to be coupled to the via 92. Heat may be easily discharged toward the second support substrate 82 through the via 92.

Referring to FIG. 6I, as another modified implementation of the semiconductor memory device 2000, a semiconductor memory device 2000b may be fabricated to further include a via 92 partially penetrating the insulation layer 308 to be electrically connected to the metal line 306 and a pad 94 on the insulation layer 308 to be coupled to the via 92. The second support substrate 82 may be removed before the via 92 and the pad 94 are formed.

FIGS. 7A to 7E illustrate cross sectional views depicting stages of a method of fabricating a semiconductor memory device according to embodiments.

Figure 7A:
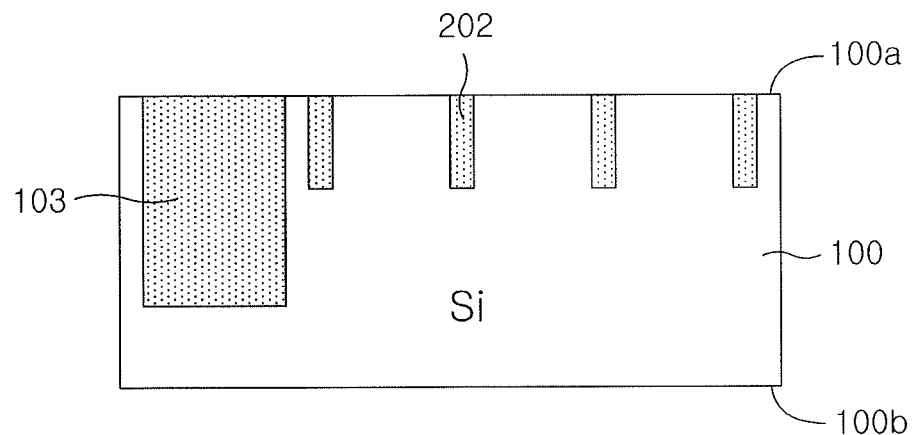
FIGS. 7A to 7E illustrate cross sectional views depicting stages of a method of fabricating a semiconductor memory device according to embodiments.

Referring to FIG. 7A, the field region 103 and the device isolation layer 202 may be provided in the semiconductor substrate 100 having the first surface 100a and the second surface 100b facing each other. The field region 103 may be deeper than the device isolation layer 202.

Figure 7B:
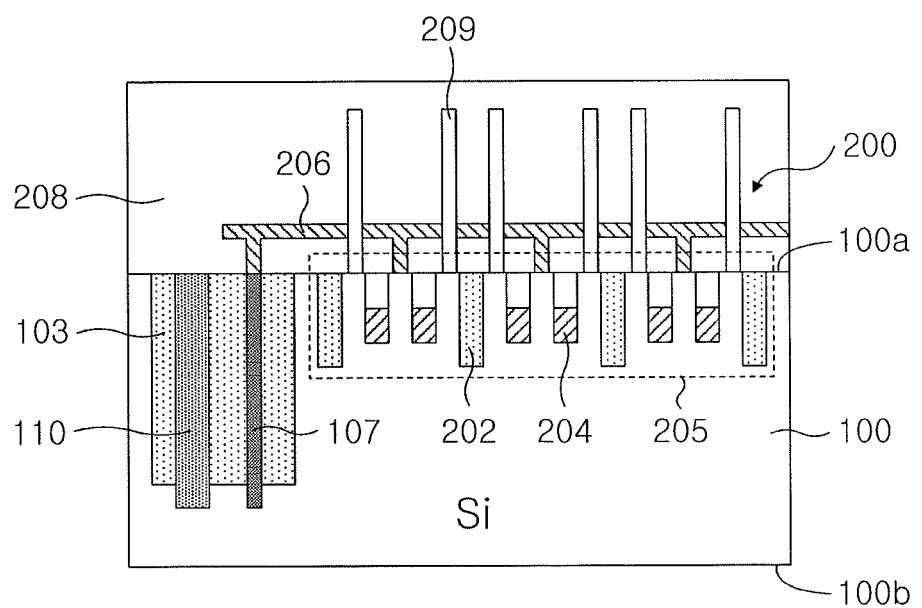

Referring to FIG. 7B, the cell array 200 may be formed on the first surface 100a of the semiconductor substrate 100. The cell array 200 may include the cell transistor 205 having the gate 204 recessed under the first surface 100a, the bit line 206 electrically connected to the cell transistor 205, and the insulation layer 208 covering the cell transistor 205 and the bit line 206. The alignment key 110 and the connection contact 107, which vertically penetrate the field region 103, may be formed when the cell array 200 is formed. The connection contact 107 may be electrically connected to the cell transistor 205. In some embodiments, the connection contact 107 may be formed simultaneously with the bit line 206.

Figure 7C:
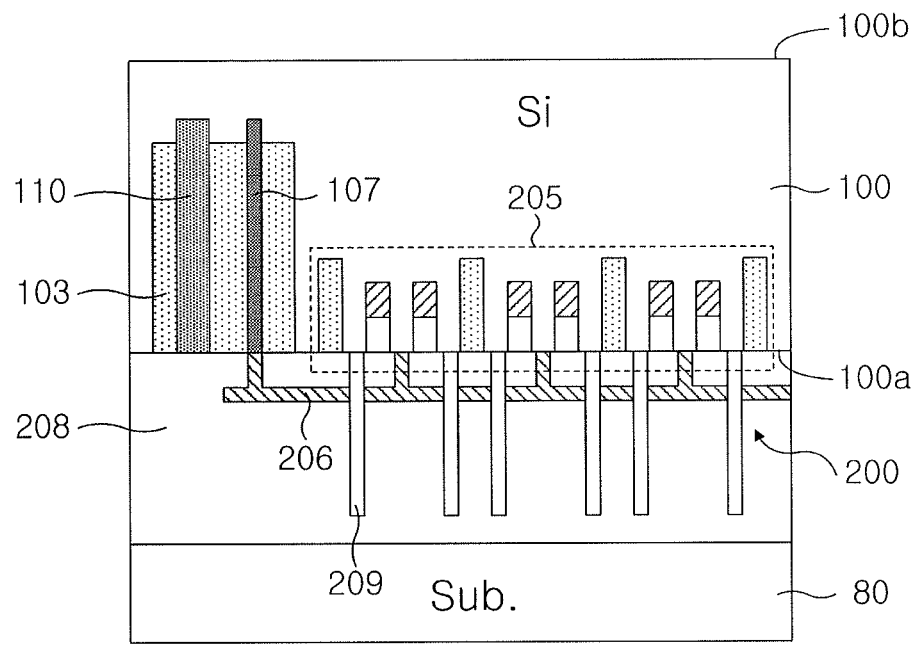

Referring to FIG. 7C, the support substrate 80 may be attached to the cell array 200, and the semiconductor substrate 100 may be turned upside down. The cell array 200 and the semiconductor substrate 100 may be sequentially stacked in an inverted state on the support substrate 80.

Figure 7D:
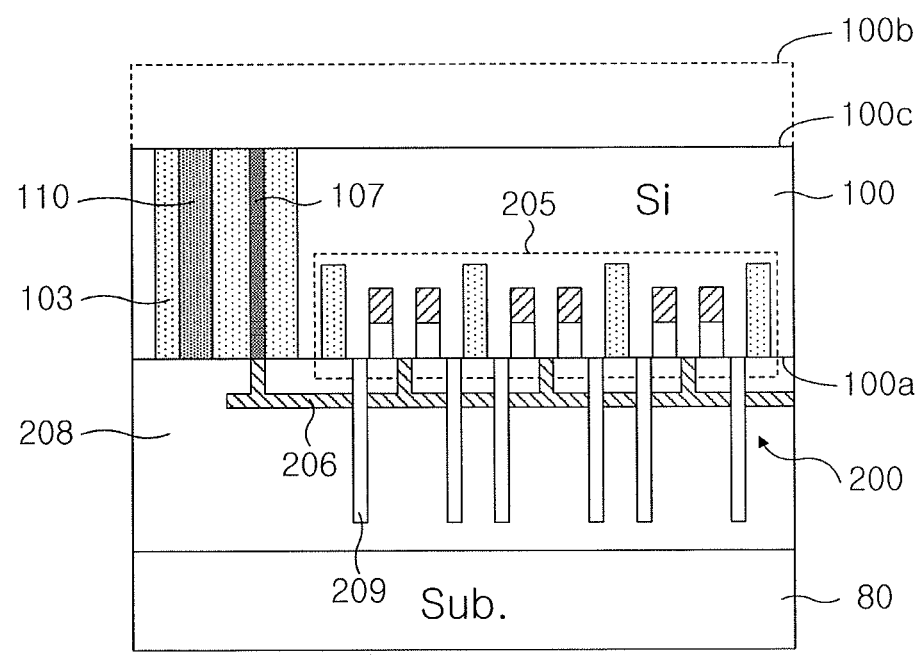

Referring to FIG. 7D, the second surface 100b of the semiconductor substrate 100 may be recessed to form the exposed third surface 100c. For example, the second surface 100b may be recessed by a chemical mechanical polishing process, a grinding process, or an etch-back process under a state that the semiconductor substrate 100 is supported by the support substrate 80. The alignment key 110 and the connection contact 107 may be exposed through the third surface 100c.

Figure 7E:
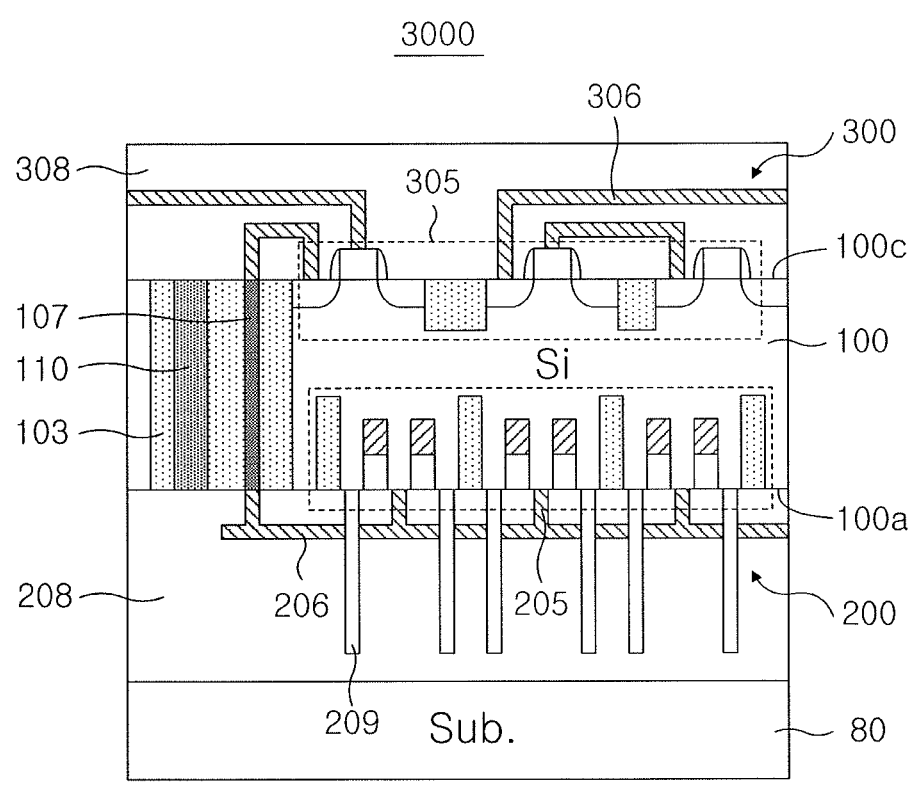

Referring to FIG. 7E, the peripheral circuit 300 may be formed on the third surface 100c of the semiconductor substrate 100. The peripheral circuit 300 may include the peripheral transistor 305 including the gate 304 on the third surface 100c, the metal line 306 electrically connected to the peripheral transistor 305, and the insulation layer 308 covering the peripheral transistor 305 and the metal line 306. The peripheral circuit 300 may be aligned with the cell array 200 by the alignment key 110. The metal line 306 may be coupled to the connection contact 107 to be electrically connected with the bit line 206 or the cell transistor 205. The peripheral circuit 300 may be electrically connected to the cell array 200 by the connection contact 107. When the peripheral circuit 300 is formed, a low temperature process may be adopted or a process recipe may be adjusted to minimize or suppress heat budget applied to the capacitor 209.

Through the processes described above, a semiconductor memory device 3000 may be fabricated including the cell transistor 205 on the first surface 100a and the peripheral transistor 305 on the third surface 100c. The semiconductor memory device 300 may constitute a POC (peripheral on cell) structure where the peripheral circuit 300 is stacked over the cell array 200 on the support substrate 80. The cell transistor 205 and the peripheral transistor 305 may be arranged in a back-to-back configuration as illustrated in FIG. 1F.

According to some implementations, the metal line 306 may be provided atop the semiconductor memory device 3000 such that heat may be easily discharged outside the semiconductor memory device 3000. The cell array 200 and the peripheral circuit 300 may avoid malfunction caused by thermal stress.

FIGS. 8A to 8E illustrate cross sectional views depicting stages of a method of fabricating an image sensor according to embodiments. FIG. 8F is a cross sectional view illustrating a modified example of FIG. 8E.

Figure 8A:
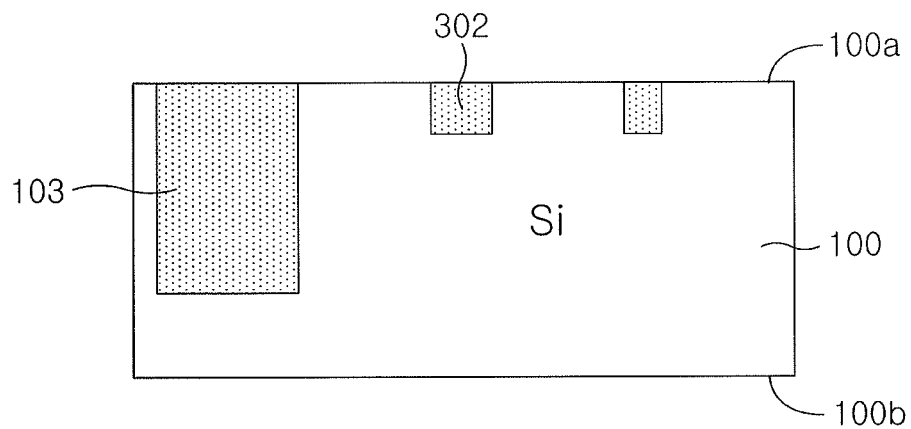
FIGS. 8A to 8E illustrate cross sectional views illustrating stages of a method of fabricating an image sensor according to embodiments.

Referring to FIG. 8A, the field region 103 and the device isolation layer 302 are provided in the semiconductor substrate 100 having the first surface 100a and the second surface 100b facing each other. The field region 103 may be deeper than the device isolation layer 302. The semiconductor substrate 100 may be a silicon substrate doped with impurities such as a p-type dopant.

Figure 8B:
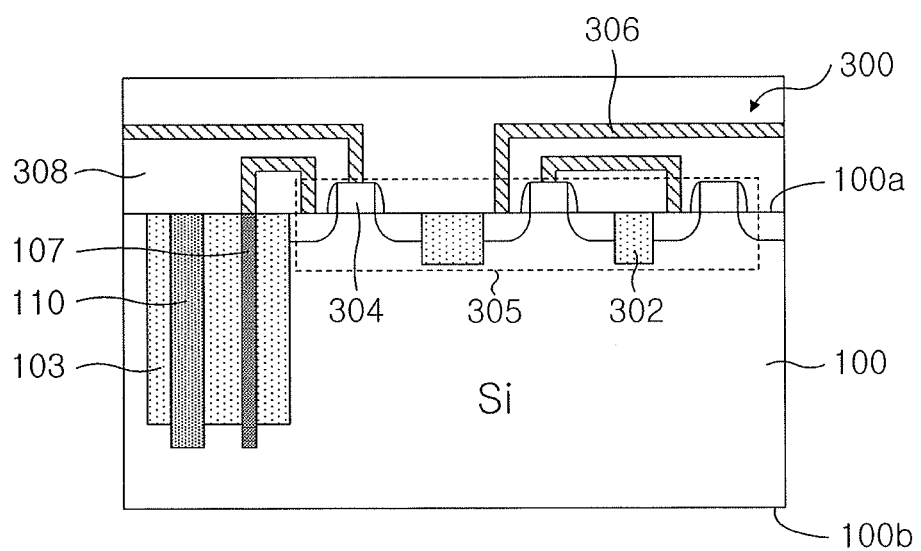

Referring to FIG. 8B, the peripheral circuit 300 may be formed on the first surface 100a of the semiconductor substrate 100. The peripheral circuit 300 may include the peripheral transistor 305 including the gate 304, the metal line 306 electrically connected to the peripheral transistor 305, and the insulation layer 308 covering the peripheral transistor 305 and the metal line 306. When the peripheral circuit 300 is formed, the alignment key 110 and the connection contact 107 may be formed to vertically penetrate the field region 103. The alignment key 110 and the connection contact 107 may extend from the first surface 100a toward the second surface 100b. The connection contact 107 may be coupled to the peripheral transistor 305 or the metal line 306 to be electrically connected with the peripheral circuit 300. In some embodiments, the connection contact 107 may be formed simultaneously with the metal line 306.

Figure 8C:
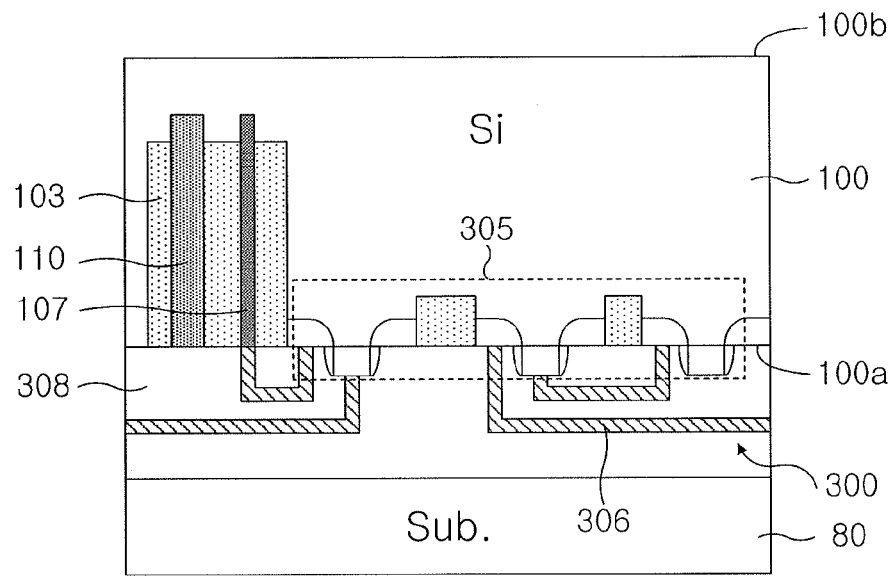

Referring to FIG. 8C, the support substrate 80 may be attached to the cell array 200, and the semiconductor substrate 100 may be turned upside down. The cell array 200 and the semiconductor substrate 100 may be sequentially stacked in an inverted state on the support substrate 80. The support substrate 80 may be a silicon substrate or non-silicon substrate, such as glass or polymer substrate.

Figure 8D:
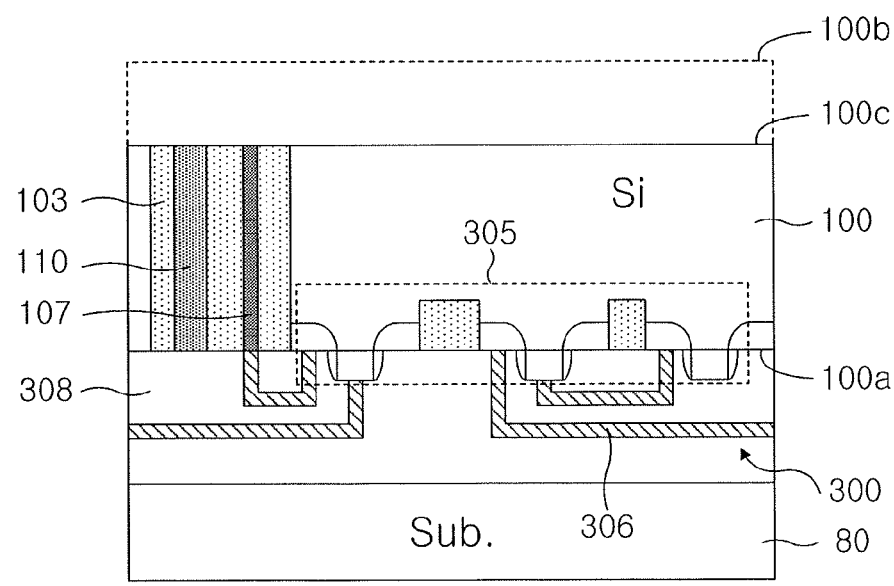

Referring to FIG. 8D, the second surface 100b of the semiconductor substrate 100 may be recessed to form the exposed third surface 100c. For example, the second surface 100b may be recessed by a chemical mechanical polishing process, a grinding process, or an etch-back process under a state that the semiconductor substrate 100 is supported by the support substrate 80. The alignment key 110 and the connection contact 107 may be exposed through the third surface 100c.

Figure 8E:
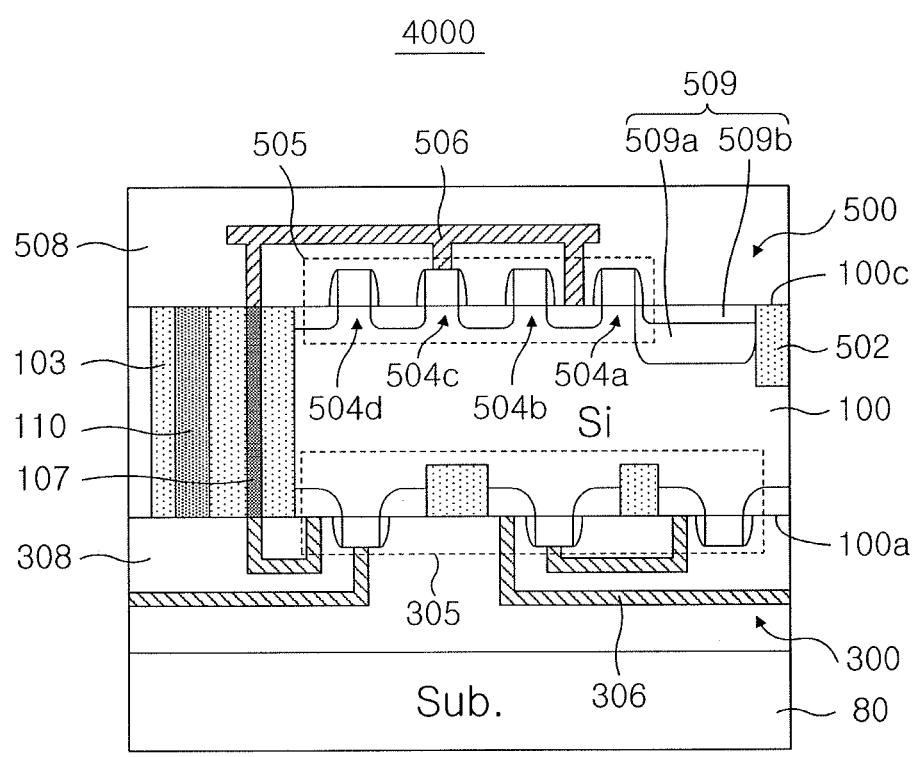
Figure 8F:
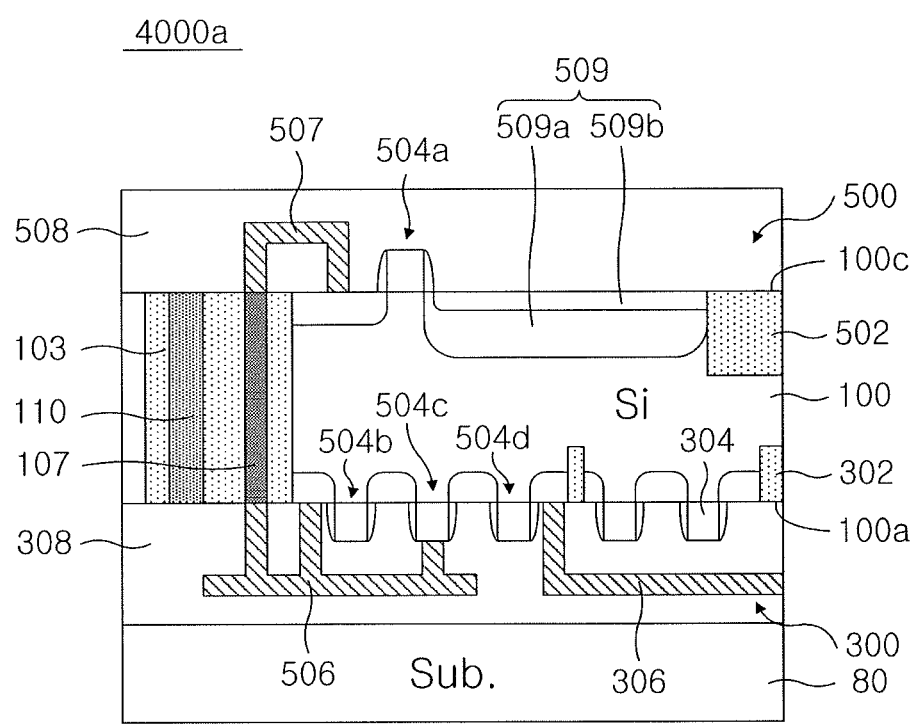
FIG. 8F illustrates a cross sectional view depicting a modified example of FIG. 8E.

Referring to FIG. 8E, a pixel array 500 may be formed on the third surface 100c of the semiconductor substrate 100. The pixel array 500 may include a device isolation layer 502, a pixel transistor 505, a photodiode 509, a connection line 506, and an insulation layer 508. The pixel transistor 505 may include a transfer transistor 504a, a reset transistor 504b, a source-follower transistor 504c, and a select transistor 504d. The pixel array 500 may be aligned with the peripheral circuit 300 by the alignment key 110. The photodiode 509 may include a first doping region 509a, which is formed by doping the semiconductor substrate 100 with first impurities (e.g., an n-type dopant), and a second doping region 509b, which is formed by doping the first doping region 509a with second impurities (e.g., a p-type dopant). The connection line 506 may electrically connect the pixel transistor 505 to the connection contact 107. The pixel array 500 may be electrically connected to the peripheral circuit 300 through the connection contact 107.

According to embodiments, identical or similar to the descriptions provided with reference to FIGS. 1A to 1E, a CMOS image sensor 400 may be fabricated to have a COP (cell on peripheral) structure where the pixel array 500 is stacked over the peripheral circuit 300 on the support substrate 80. The peripheral transistor 305 may be provided on the first surface 100*a* and the pixel transistor 505 may be provided on the third surface 100*c*. Therefore, the peripheral transistor 305 and the pixel transistor 505 may be arranged in the back-to-back configuration as illustrated in FIG. 1F.

In another exemplary embodiment, as illustrated in FIG. 8F, a CMOS image sensor 400*a* may be fabricated to include the transfer transistor 504*a* formed on the third surface 100*c*, and the other transistors 504*b*, 504*c* and 504*d* formed on the first surface 100*a*. For example, as illustrated in FIG. 8B, when the peripheral circuit 300 is formed, the reset transistor 504*b*, the source-follower transistor 504*c*, the select transistor 504*d* and the connection line 506 may be formed on the first surface 100*a* of the semiconductor substrate 100. And, as illustrated in FIG. 8E, when the pixel array 500 is formed, the transfer transistor 504*a*, the photodiode 509 and a second connection line 507 electrically connected to the connection contact 107, and the transfer transistor 504*a* may be formed on the third surface 100*c* of the semiconductor substrate 100.

FIGS. 9A to 9F illustrate cross sectional views illustrating a method of fabricating an image sensor according to embodiments.

Figure 9A:
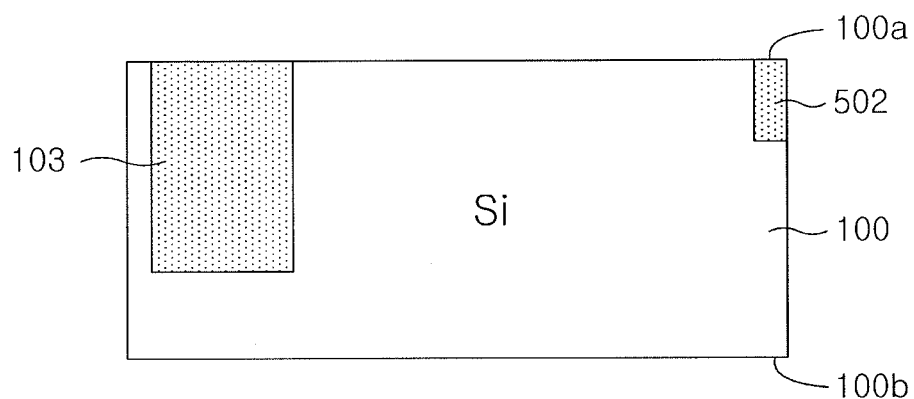
FIGS. 9A to 9F illustrate cross sectional views depicting stages of a method of fabricating an image sensor according to embodiments.

Referring to FIG. 9A, the field region 103 and the device isolation layer 502 are provided in the semiconductor substrate 100 having the first surface 100*a* and the second surface 100*b* facing each other. The field region 103 may be deeper than the device isolation layer 502. The semiconductor substrate 100 may be a silicon substrate doped with impurities such as a p-type dopant.

Figure 9B:
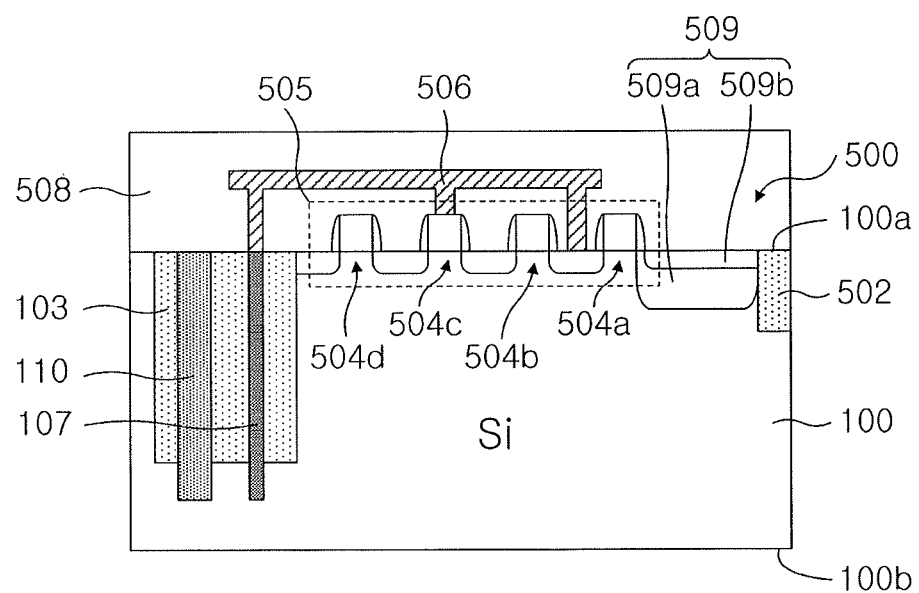

Referring to FIG. 9B, the pixel array 500 may be formed on the first surface 100*a* of the semiconductor substrate 100. The pixel array 500 may include the pixel transistor 505, the photodiode 509, the connection line 506, and the insulation layer 508. When the pixel array 500 is formed, the alignment key 110 and the connection contact 107 may be formed to vertically penetrate the field region 103. The alignment key 110 and the connection contact 107 may extend from the first surface 100*a* toward the second surface 100*b*. The connection contact 107 may be coupled to the pixel transistor 505 or the connection line 506 to be electrically connected with the pixel array 500. In some implementations, the connection contact 107 may be formed simultaneously with the pixel array 500.

The pixel transistor 505 may include the transfer transistor 504*a*, the reset transistor 504*b*, the source-follower transistor 504*c*, and the select transistor 504*d*. The photodiode 509 may include the first doping region 509*a* doped with first impurities (e.g., an n-type dopant) and the second doping region 509*b* doped with second impurities (e.g., a p-type dopant). The connection line 506 may electrically connect the pixel transistor 505 to the connection contact 107.

Figure 9C:
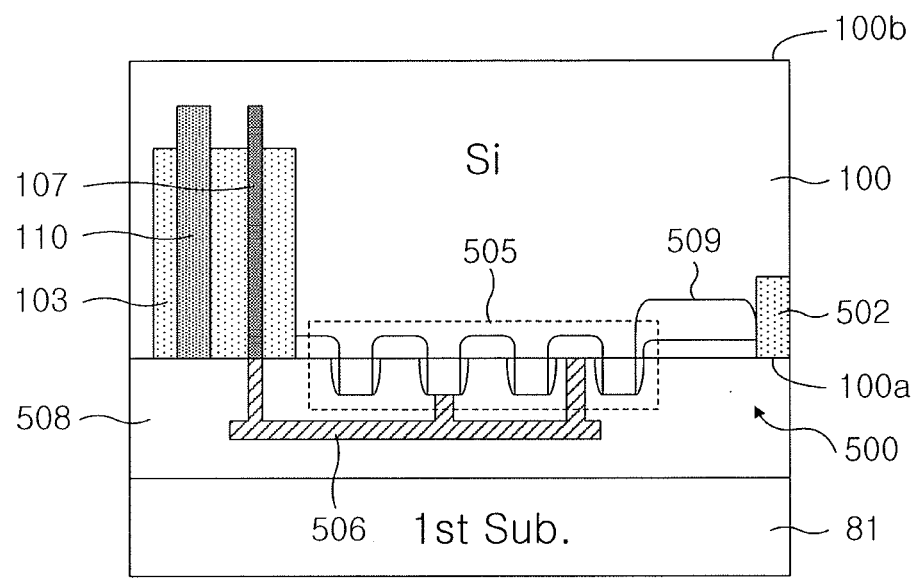

Referring to FIG. 9C, the first support substrate 81 may be attached to the pixel array 500, and the semiconductor substrate 100 may be turned upside down. The pixel array 500 and the semiconductor substrate 100 may be sequentially stacked in an inverted state on the first support substrate 81.

Figure 9D:
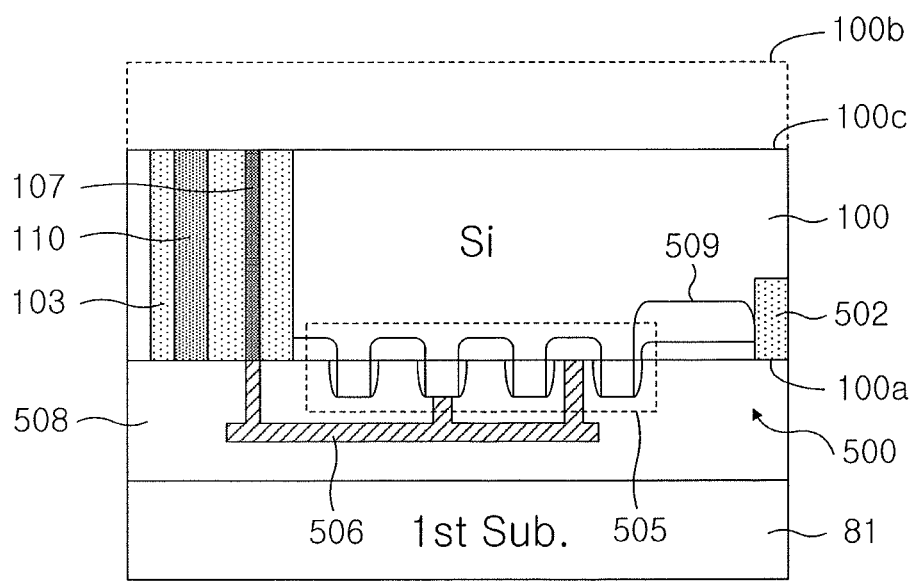

Referring to FIG. 9D, the second surface 100*b* of the semiconductor substrate 100 may be recessed to form the exposed third surface 100*c*. For example, the second surface 100*b* may be recessed by a chemical mechanical polishing process, a grinding process, or an etch-back process under a state that the semiconductor substrate 100 is supported by the first support substrate 81. The alignment key 110 and the connection contact 107 may be exposed through the third surface 100*c*.

Figure 9E:
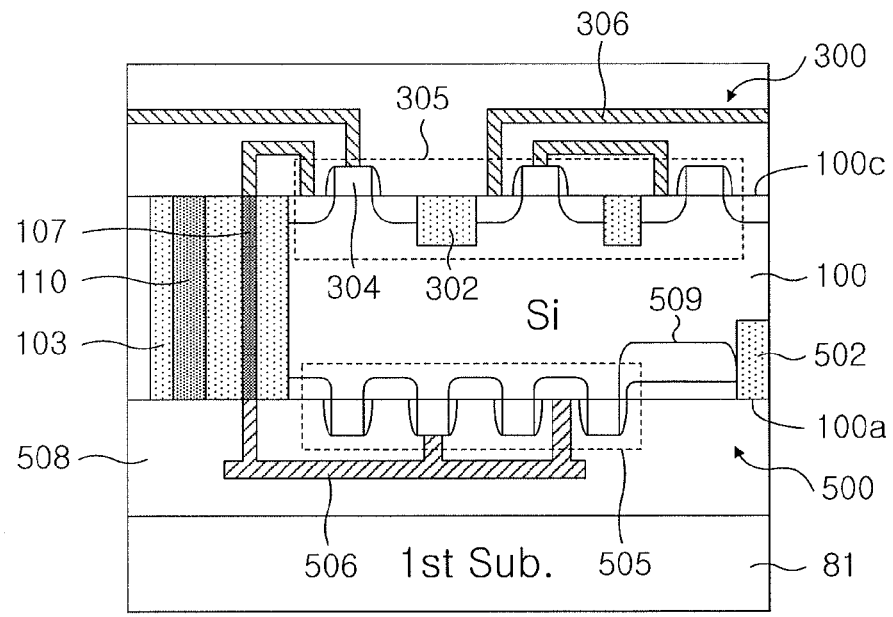

Referring to FIG. 9E, the peripheral circuit 300 may be formed on the first surface 100*a* of the semiconductor substrate 100. The peripheral circuit 300 may include the peripheral transistor 305 including the gate 304, the metal line 306 electrically connected to the peripheral transistor 305, and the insulation layer 308 covering the peripheral transistor 305 and the metal line 306. The peripheral circuit 300 may be aligned with the pixel array 500 by the alignment key 110. The metal line 306 may be coupled to the connection contact 107 to be electrically connected with the connection line 506. The peripheral circuit 300 may be electrically connected with the pixel array 500 by the connection contact 107. According to some implementations, identical or similar to the descriptions with reference to FIGS. 4A to 4E, there may be formed a POC (peripheral on cell) structure where the peripheral circuit 300 is stacked over the pixel array 500 on the first support substrate 81.

Figure 9F:
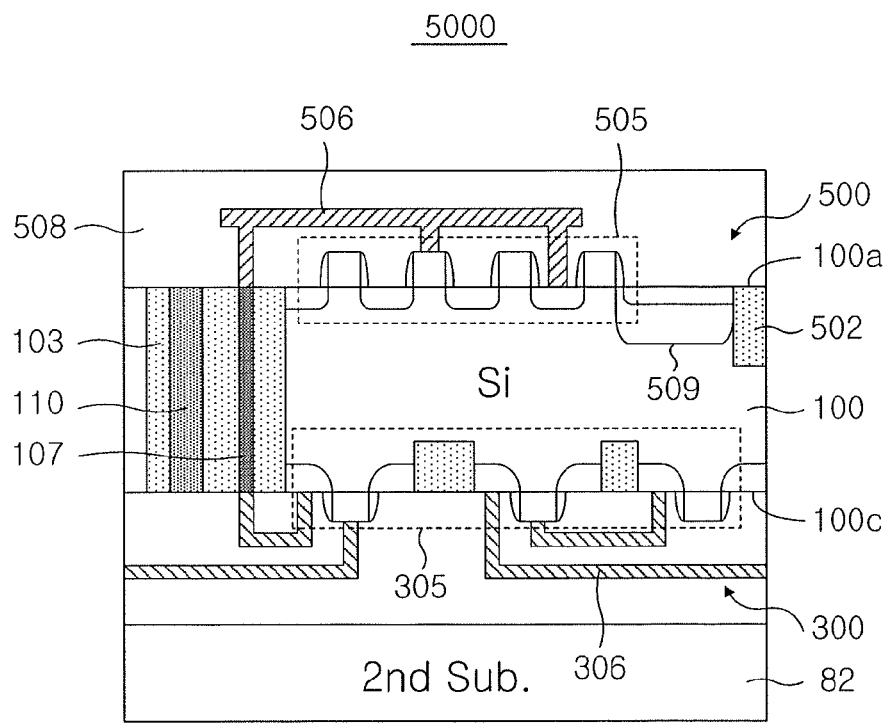

Referring to FIG. 9F, the first support substrate 81 may be removed to fabricate a CMOS image sensor 5000. Selectively, the second support substrate 82 may be further attached onto the peripheral circuit 300. The CMOS image sensor 5000 may have substantially the same structure as the CMOS image sensor 4000 illustrated in FIG. 8E. Identical or similar to the CMOS image sensor 4000*a* as illustrated in FIG. 8F, the transfer transistor 504*a* may be formed on the first surface 100*a* of the semiconductor substrate 100, and the other transistors 504*b*, 504*c* and 504*d* may be formed on the third surface 100*c* of the semiconductor substrate 100.

Figure 10A:
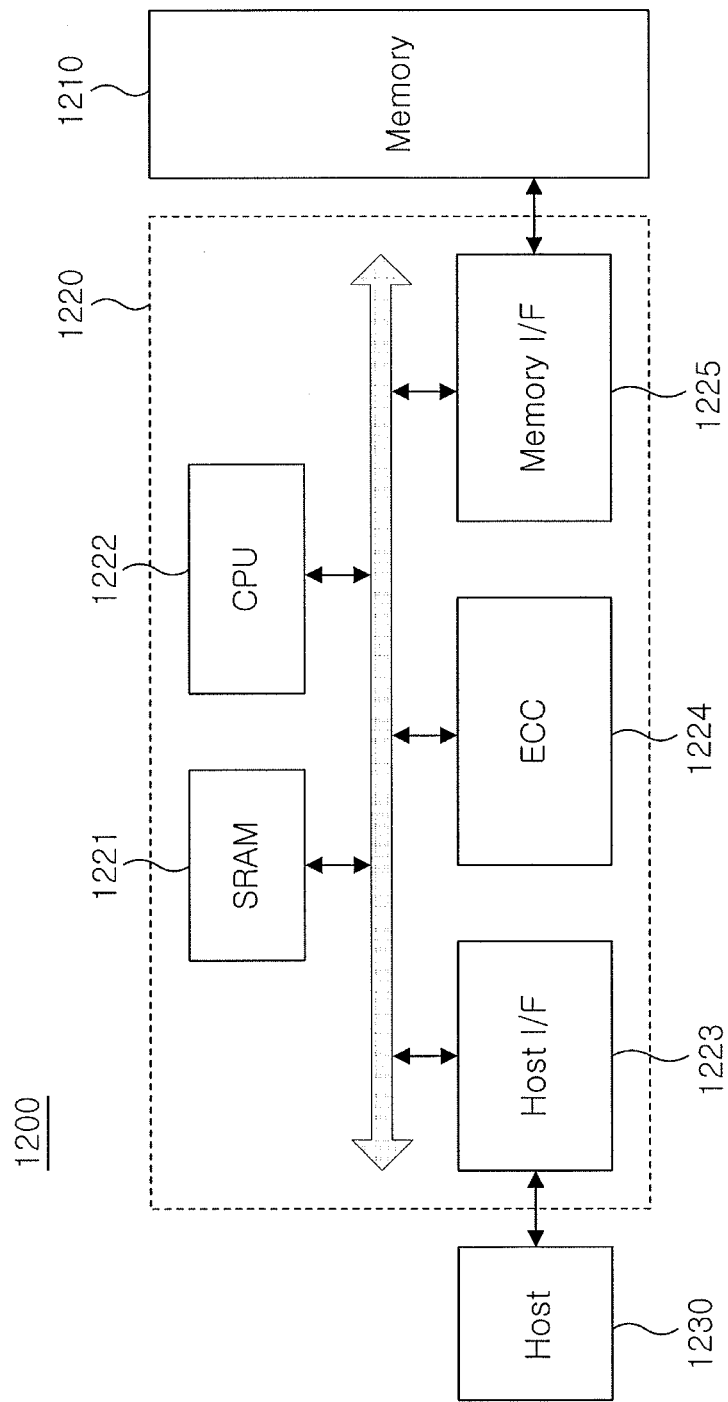
FIG. 10A illustrates a schematic block diagram depicting an example of a memory card including at least one of semiconductor devices according to embodiments.

FIG. 10A illustrates a schematic block diagram depicting an example of a memory card including at least one of the semiconductor devices according to embodiments.

Referring to FIG. 10A, a memory 1210 including at least one of the semiconductor devices 1 to 3000*a* according to exemplary embodiments is applied to a memory card 1200. For example, the memory card 1200 may include a memory controller 1220 generally controlling data exchange between a host 1230 and the memory 1210. An SRAM 1221 may be used as a work memory of a processing unit 1222. A host interface 1223 may have a data exchange protocol of the host 1230 connected to the memory card 1200. An error correction coding block 1224 may detect and corrects error contained in data read from the memory 1210. A memory interface 1225 may interface the memory 1210. The processing unit 1222 may generally control data exchange of the memory controller 1220.

Figure 10B:
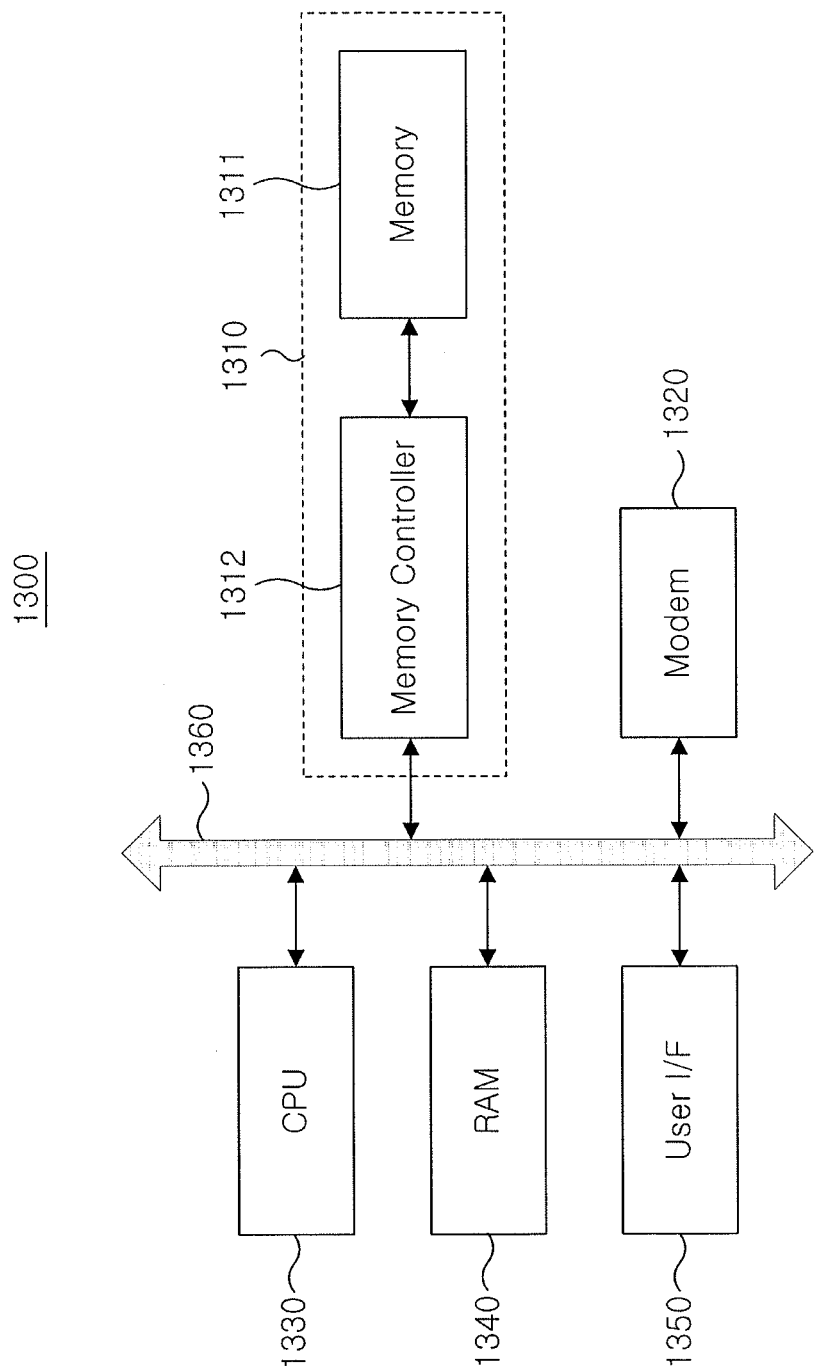
FIG. 10B illustrates a schematic block diagram depicting an example of information process system including at least one semiconductor device according to embodiments.

FIG. 10B illustrates a schematic block diagram depicting an example of information process system including at least one of semiconductor devices according to embodiments.

Referring to FIG. 10B, an information processing system 1300 may include a memory system 1310 having at least one of the semiconductor devices 1 to 3000*a* according to exemplary embodiments. The information processing system 1300 may include a mobile device or a computer. For example, the information processing system 1300 may include a modem 1320, a central processing unit 1330, a RAM 1340, and a user interface 1350. The memory system 1310 may include a memory 1311 and a memory controller 1312 and may have substantially the same configuration as that of the memory card 1200 in FIG. 10A. The memory system 1310 may store data processed by the central processing unit 1330 or data input from the outside. The information process system 1300 may be provided as a memory card, a semiconductor device disk, a camera image sensor, or other application chipsets. For example, the memory system 1310 may be realized as a solid state drive (SSD). In this case, the information processing system 1300 may stably store large amounts of data in the memory system 1310.

Figure 10C:
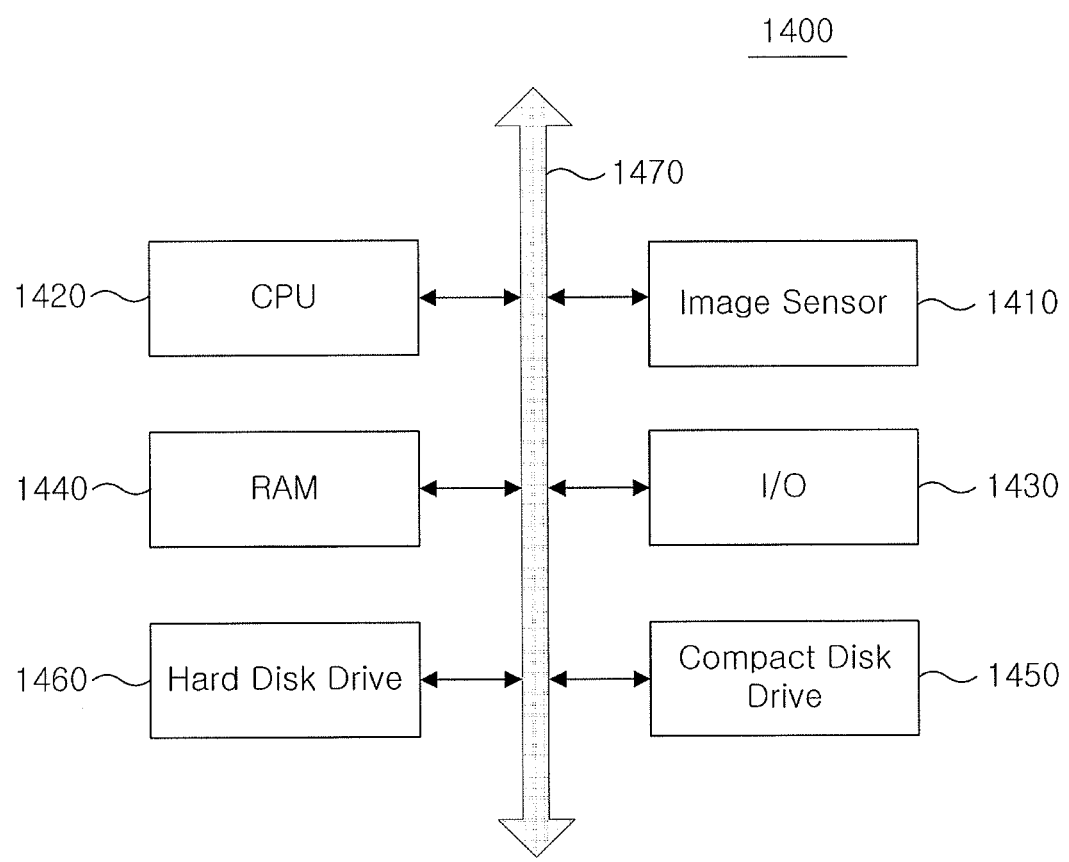
FIG. 10C illustrates a schematic block diagram depicting an example of information process system including at least one of image sensor according to embodiments

FIG. 10C illustrates a schematic block diagram depicting an example of information process system including at least one of image sensors according to embodiments.

Referring to FIG. 10C, an information process system 1400 may include a central processing unit 1420, an image sensor 1410, a RAM 1440, an input/output device 1430, a compact disk drive 1450 and a hard disk drive 1460 which communicate with each other through a bus 1470. The image sensor 1410 may include at least one of the CMOS image sensors 4000, 4000*a* and 5000 according to exemplary embodiments. The image sensor 1410 may communicate with the central processing unit 1420 or the other devices 1440 to 1460 about data and/or control signals. The image sensor 1410 may provide a signal defining some image based on the data and/or control signals to the central processing unit 1420, and the central processing unit 1420 may treat the signals from the image sensor 1410.

By way of summation and review, an approach to obtain high integration in a semiconductor device is to provide a three dimensional structure. Fabrication of a three dimensional structure of a semiconductor device has generally been carried out by stacking another semiconductor substrate on a semiconductor substrate or by forming a single crystalline semiconductor layer on a semiconductor substrate. However, forming an electrical interconnection between the stacked semiconductor devices may raise issues such as complexity of a process of forming the electrical interconnection, difficulty in achieving a fine alignment, carrying out the process within a heat budget, and so forth. For example, in a conventional stacking structure, attachment of a single crystalline silicon layer onto a formed cell array is needed to form a peripheral circuit on the cell array. Moreover, a deep vertical contact is needed to electrically connect the peripheral circuit to the cell array, and it may be difficult to secure alignment between the cell array and the peripheral circuit.

Embodiments provide semiconductor devices and methods for fabricating the same in which a cell array is provided on one side of a semiconductor substrate and a peripheral circuit is provided one the other side. Accordingly, the amount of integration may be increased and the chip area may be decreased. Moreover, the electrical characteristics of the semiconductor devices may be improved due to an exact vertical alignment between the cell array and the peripheral circuit, avoidance of the thermal budget, and maximization of respective characteristics of the cell array and the peripheral circuit.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A semiconductor device, comprising:
a semiconductor substrate including an upper surface and a lower surface, the lower surface being opposite the upper surface;
an upper circuit on the upper surface of the semiconductor substrate;
a lower circuit on the lower surface of the semiconductor substrate;
a vertical connection contact that penetrates the semiconductor substrate to electrically connect the upper circuit to the lower circuit; and
an alignment key that penetrates the semiconductor substrate to vertically align the upper circuit with the lower circuit,
wherein the semiconductor substrate includes an insulation layer interposed between the upper circuit and the lower circuit, and
the alignment key vertically penetrates the insulation layer.

2. The semiconductor device as claimed in claim 1, wherein:
the upper circuit includes a cell array including a cell transistor,
the lower circuit includes a peripheral circuit including a peripheral transistor, and
the cell transistor and the peripheral transistor are vertically symmetric with respect to the semiconductor substrate.

3. The semiconductor device as claimed in claim 2, wherein:
the cell array further includes a bit line electrically connected to the cell transistor,
the lower circuit further includes a metal line electrically connected to the peripheral transistor, and
the connection contact electrically connects the bit line to the metal line.

4. The semiconductor device as claimed in claim 3, further comprising:
a support substrate attached onto the lower circuit;
a via that penetrates the support substrate to be electrically connected to the metal line; and
a pad disposed on the support substrate to be coupled to the via,
wherein the metal line is interposed between the semiconductor substrate and the support substrate.

5. A semiconductor device, comprising:
a semiconductor substrate having a first surface and a second surface opposite the first surface;
a cell array including a cell transistor on the first surface of the semiconductor substrate;
a peripheral circuit including a peripheral transistor on the second surface of the semiconductor substrate;
an alignment key that extends from the first surface to the second surface such that the alignment key vertically aligns the cell array with the peripheral circuit; and
a connection contact that extends from the first surface to the second surface such that the connection contact electrically connects the cell array to the peripheral circuit,
wherein the cell transistor and the peripheral transistor are vertically symmetric with respect to the semiconductor substrate.

6. The semiconductor device as claimed in claim 5, wherein:
the cell array further includes a bit line electrically connected to the cell transistor, and the peripheral circuit further includes a metal line electrically connected to the peripheral transistor, the connection contact electrically connecting the bit line to the metal line.

7. The semiconductor device as claimed in claim 6, wherein the cell array further includes a capacitor on the cell transistor, the capacitor being electrically connected to the cell transistor.

8. The semiconductor device as claimed in claim 6, further comprising:
   a support substrate on the peripheral circuit;
   a via that penetrates the support substrate to be electrically connected to the metal line; and
   an external terminal on the support substrate, the external terminal being electrically connected to the via.

9. The semiconductor device as claimed in claim 8, wherein the metal line is more adjacent to the support substrate rather than the semiconductor substrate.

10. The semiconductor device as claimed in claim 5, wherein the semiconductor substrate includes an insulation layer between the cell array and the peripheral circuit, at least one of the alignment key and the connection contact vertically penetrating the insulation layer.

11. The semiconductor device as claimed in claim 6, wherein the peripheral circuit further includes a via that partially penetrates therethrough to be in contact with the metal line and an external terminal electrically connected to the via.

12. The semiconductor device, comprising:
   a semiconductor substrate having an upper surface and a lower surface opposite the upper surface;
   a field region that extends from the upper surface through the semiconductor substrate to the lower surface;
   an insulative alignment key that penetrates through the field region from the upper surface to the lower surface;
   a conductive connection contact that penetrates through the field region from the upper surface to the lower surface;
   a first circuit on the upper surface of the semiconductor substrate such that the first circuit is electrically connected to the connection contact; and
   a second circuit on the lower surface of the semiconductor substrate such that the second circuit is electrically connected to the connection contact,
   wherein the alignment key vertically aligns the first circuit with the second circuit.

13. The semiconductor device as claimed in claim 12, wherein one of the first circuit and the second circuit includes a cell array including a cell transistor and another of the first circuit and the second circuit includes a peripheral circuit including a peripheral transistor, and
   the cell transistor and the peripheral transistor are symmetric with respective to the semiconductor substrate.

14. The semiconductor device as claimed in claim 13, wherein the cell array further includes a bit line and a capacitor that are electrically connected to the cell transistor, and the peripheral circuit further includes a metal line electrically connected to the peripheral transistor.

15. The semiconductor device as claimed in claim 14, further comprising:
   a support substrate on the peripheral circuit;
   a via that penetrates the support substrate and is electrically connected to the metal line; and
   an external terminal on the support substrate, the external terminal electrically connected to the via.

\* \* \* \* \*